(12) United States Patent  
Tadokoro et al.

(10) Patent No.: US 8,409,890 B2
(45) Date of Patent: Apr. 2, 2013

(54) SEMICONDUCTOR DEVICE AND MANUFACTURING METHOD THEREOF

(75) Inventors: Asami Tadokoro, Tokyo (JP); Masashi Fujita, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 623 days.

(21) Appl. No.: 12/577,367

(22) Filed: Oct. 12, 2009

(65) Prior Publication Data

US 2010/0096736 A1 Apr. 22, 2010

(30) Foreign Application Priority Data

Oct. 16, 2008 (JP) ................................ 2008-267427

(51) Int. Cl.
*H01L 21/00* (2006.01)
(52) U.S. Cl. .......................................................... 438/34
(58) Field of Classification Search .................. None
See application file for complete search history.

(56) References Cited

U.S. PATENT DOCUMENTS

| 5,914,626 A | 6/1999 | Kim et al. |
| 2004/0262783 A1* | 12/2004 | Ido et al. ....................... 257/797 |
| 2005/0072911 A1* | 4/2005 | Kuroda et al. ............. 250/231.13 |
| 2006/0072364 A1* | 4/2006 | Yoshida et al. ............. 365/225.7 |
| 2006/0267771 A1 | 11/2006 | Shionoiri et al. |
| 2007/0158781 A1* | 7/2007 | Khan et al. ....................... 257/529 |
| 2010/0072574 A1 | 3/2010 | Ohshima |
| 2010/0078484 A1 | 4/2010 | Matsumoto et al. |

FOREIGN PATENT DOCUMENTS

| JP | 60-219703 | 11/1985 |
| JP | 6-295591 | 10/1994 |
| JP | 9-298280 | 11/1997 |
| JP | 2002-231889 | 8/2002 |
| JP | 2004-247877 | 9/2004 |
| JP | 60-219703 | 11/2005 |
| JP | 2006-49711 | 2/2006 |
| JP | 2007-5778 | 1/2007 |
| JP | 2007-48183 | 2/2007 |

OTHER PUBLICATIONS

English translation of JP9298280, downloaded on Jun. 6, 2012, 5 pgs.*
International Searching Authority Invitation to Pay Additional Fees, re International Application No. PCT/JP2009/066853, dated Oct. 27, 2009.

* cited by examiner

*Primary Examiner* — David E Graybill
(74) *Attorney, Agent, or Firm* — Husch Blackwell LLP

(57) ABSTRACT

A structure capable of changing the characteristic value of an element after the formation of the element in order to prevent the increase of the manufacturing cost and delay in the delivery of a product. A plurality of diodes is connected in series. Then, a part of the plurality of diodes is short-circuited by a wiring. In specific, a diode and a wiring are connected in parallel, whereby a current flows preferentially into the wiring, so that the diode can be regarded as nonexistent. Then, the wiring is cut at a part of the wiring, thereby having the diode which is connected to the wiring in parallel before the cutting functioning.

7 Claims, 29 Drawing Sheets

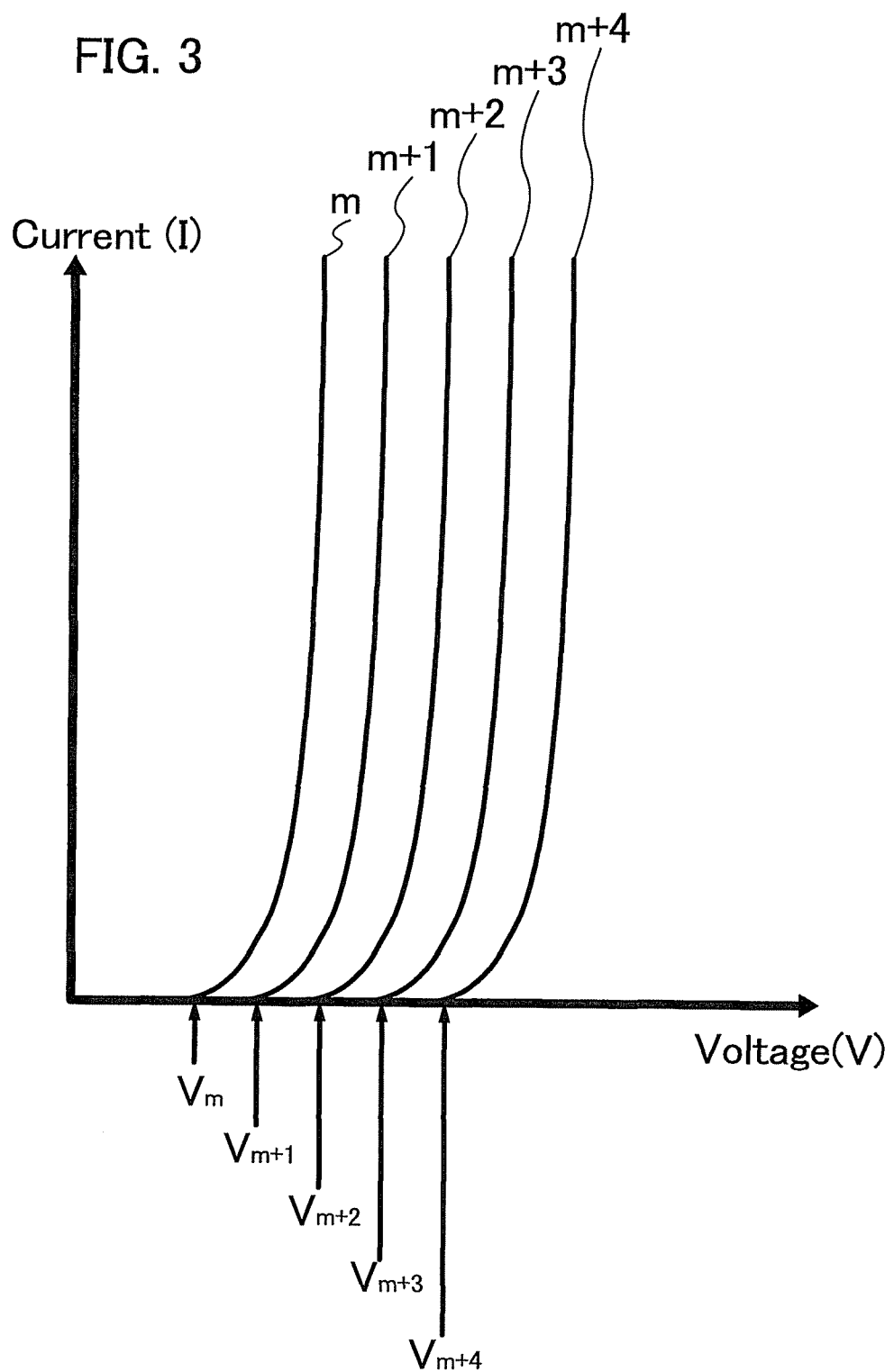

8004a   8004b   8004c

SEMICONDUCTOR DEVICE AND MANUFACTURING METHOD THEREOF

TECHNICAL FIELD

The technical field of the present invention relates to a semiconductor device, a manufacturing method of a semiconductor device, a circuit, a manufacturing method of a circuit, a diode, a manufacturing method of a diode, an antenna, a manufacturing method of an antenna, or the like.

BACKGROUND ART

For the realization of ubiquitous computing, development of semiconductor devices which perform wireless communication via an antenna (also called RFID tags, wireless tags, IC chips, wireless chips, noncontact signal processing equipment, or semiconductor integrated circuit chips) has been advanced (for example, Patent Document 1).
(Patent Document 1)
Japanese Published Patent Application No. 2007-5778

DISCLOSURE OF INVENTION

Generally, characteristic values of an element used in semiconductor devices, which are mostly determined by the parameter determined in designing, cannot be changed after the formation of the element.

However, in the manufactured semiconductor devices, there are some cases where a circuit does not operate in accordance with the parameter determined in designing.

In that case, it is necessary to change its design and manufacture a semiconductor device again, resulting in increase of the manufacturing cost and delay in the delivery of a product.

The present invention described herein has an object to provide a structure capable of changing the characteristic value of an element after the formation of the element in order to prevent the increase of the manufacturing cost and delay in the delivery of a product.

As the element with the characteristic value which is capable of being changed, described in this specification, there are the following two kinds of elements: an element using a diode and an element using an antenna.

In order to solve the above-described problem, in accordance with the present invention, a plurality of diodes is connected in series.

Then, a part of the plurality of diodes is short-circuited by a wiring. In specific, a diode and a wiring are connected in parallel.

The short-circuiting of a plurality of diodes has the diode short-circuited by the wiring nonfunctioning.

The diode and the wiring are connected in parallel, whereby a current flows preferentially into the wiring, so that the diode can be regarded as nonexistent.

Then, if the threshold voltage or the current value of the element using a plurality of diodes is not a predetermined value, the wiring is cut at a part of the wiring, thereby having the diode which is connected to the wiring in parallel before the cutting functioning, so that the threshold voltage or the current value of the element using a plurality of diode can be adjusted.

As examples of the case where the threshold voltage or the current value of the element using a plurality of diode is not a predetermined value, there are the following cases: the case where current leakage occurs in a diode which is not short-circuited by the wiring; the case where the threshold voltage or the current value of each and individual diode which is not short-circuited by the wiring is not a threshold voltage or a current value which is assumed at the time of design; and the like.

When the diode which is not short-circuited by the wiring is referred to as a primary diode, the diode which is short-circuited by the wiring is referred to as a secondary diode, the primary diode is referred to as a first unit, and a structure including the wiring and the secondary diode is referred to as a second unit, a plurality of first units and a plurality of second units are connected in series.

In this specification, the adjective, a "plurality of" is synonymous with the noun, "group". (For example, a "plurality of diodes" is synonymous with a "diode group", and a "plurality of small loops" is synonymous with a "small-loop group".)

Alternatively a switching element can be disposed instead of the wiring in order to adjust the threshold voltage or the current value.

However, that case is disadvantage in design because the formation of the switching element and a controller for the switching element deprives the area for disposition of another circuit.

Moreover, in the method using the switching element, it is necessary that voltage keep being applied using a controller on a gate terminal of the switching element during the period in which a part of a plurality of diodes is short-circuited, which increases power consumption.

Therefore, considering the power consumption and design convenience, it can be said that it is more preferable to use the structure using a wiring.

The structure using a switching element is, on the other hand, preferable in that the threshold voltage or the current value can be adjusted any number of times.

That is, either method has some drawback and advantage and is preferably used, as appropriate depending on the need.

As examples of the method for cutting in the structure using a wiring, various kinds of methods such as laser cutting, cutting using scissors, cutting using a cutter, and cutting using a needle can be applied.

However, the usage of the scissors, the cutter, the needle, or the like may cause break of a circuit or an interlayer insulating film which is disposed around the wiring that is to be cut, due to stress at the time of the cutting.

Further, when the cutting using scissors, a cutter, a needle, or the like is performed after the sealing, the sealing is broken.

Therefore, laser cutting is more preferable in that cutting can be performed without causing stress breakdown or sealing breaking.

In particular, laser cutting is preferable in a semiconductor device using a thin film.

This is because laser cutting enables the cutting of only the wiring selectively even in the case where the wiring is covered with an interlayer insulating film, a sealing material, or the like.

Note that a material for forming an interlayer insulating film, such as polyimide, a material for sealing, such as prepreg or epoxy, or the like can be cut by a YAG laser having a wavelength of 355 nm, but cannot be cut by a YAG laser having a wavelength of 1064 nm, a YAG laser having a wavelength of 532 nm, a YLF laser having a wavelength of 1047 nm, or the like.

Therefore, in order to selectively cut only the wiring without breaking the interlayer insulating film and the sealing, it is preferable to use a YAG laser having a wavelength of 1064 nm, a YAG laser having a wavelength of 532 nm, an YLF laser having a wavelength of 1047 nm, or the like. In the case where it does not matter if the interlayer insulating film and/or the sealing are/is broken, any kind of laser can be used.

As the diode, any kind of diode such as a diode-connected transistor, a PIN diode, a PN diode, or a Schottky diode can be used.

In order to form the diode at the same time as the formation of a transistor, a resistor, or a capacitor, which is another circuit element, the diode-connected transistor, the PIN diode, the PN diode, or the like is preferable.

Further, it is preferable that the width of a diode which is connected to the wiring in parallel (the diode is referred to as a secondary diode), in the direction which is vertical to the direction current flows be smaller than the width of a diode which is not connected to the wiring in parallel (the diode is referred to as a primary diode), in the direction which is vertical to the direction current flows.

Decrease of the width of the secondary diode, in the direction which is vertical to the direction current flows reduces the area of the secondary diode, which contributes to sophistication of a semiconductor device.

Furthermore, the decrease of the width of the secondary diode, in the direction which is vertical to the direction current flows reduces the amount of current which flows into the secondary diode, so that the amount of correction of the threshold voltage by cutting the wiring and having the secondary diode functioning is small.

The small amount of correction of the threshold voltage enables voltage adjustment with respect to the threshold voltage or the current value to be finely performed.

Note that the width of a diode, in the direction which is vertical to the direction current flows is, in the case of a diode including a transistor for example, the channel width of the transistor.

Further, with respect to the reduction of the area, it is acceptable that the width of the primary diode, in the direction which is vertical to the direction current flows be smaller than the width of the secondary diode, in the direction which is vertical to the direction current flows.

That is, the diodes are designed such that the width of the primary diode, in the direction which is vertical to the direction current flows be different from the width of the secondary diode, in the direction which is vertical to the direction current flows.

The application range of the present invention includes not only a diode but also an antenna.

In the case of an antenna, the antenna length can be increased, so that the inductance can be increased (in the case of an element in which antennas are connected in series, the above "antenna length" is described as the element length).

The antenna length means the shortest distance from an input terminal of the antenna to an output terminal of the antenna within the antenna.

The inductance is, when the current of an antenna (or an element including an antenna) changes, a ratio of electromotive force which occurs in the antenna (or the element including an antenna), divided by the rate of current change.

According to the above structure, a semiconductor device capable of changing the characteristic value (threshold voltage, current value, inductance, or the like) can be provided.

For example, in accordance with the present invention, the following can be provided.

In accordance with the present invention, a semiconductor device including an element in which a part of a serially-connected diode group is connected in parallel to a wiring can be provided.

In accordance with the present invention, a semiconductor device including an element in which a first diode group and a second diode group are connected in series can be provided wherein each diode in the second diode group is connected to a wiring in parallel and the width of the diode in the second diode group, in the direction which is vertical to the direction current flows is smaller than the width of each diode in the first diode group, in the direction which is vertical to the direction current flows.

In accordance with the present invention, a manufacturing method of a semiconductor device including an element in which a part of a serially-connected diode group is connected in parallel to a wiring can be provided wherein the threshold voltage or the current value of the element is adjusted by cutting the wiring.

In accordance with the present invention, a manufacturing method of a semiconductor device including an element in which a first diode group and a second diode group are connected in series wherein each diode in the second diode group is connected to a wiring in parallel and the width of the diode in the second diode group, in the direction which is vertical to the direction current flows is smaller than the width of each diode in the first diode group, in the direction which is vertical to the direction current flows can be provided wherein the threshold voltage or the current value of the element is adjusted by cutting the wiring.

Further, it is preferable that the diode and the wiring are each formed using a thin film and the cutting is performed by laser cutting.

In accordance with the present invention, a semiconductor device in which a part of a serially-connected antenna group is connected in parallel to a wiring can be provided.

In accordance with the present invention, a semiconductor device including an antenna having a large loop and a small-loop group which is connected to the large loop can be provided.

In accordance with the present invention, a manufacturing method of a semiconductor device including an element in which a part of a serially-connected antenna group is connected in parallel to a wiring can be provided wherein the inductance of the element is adjusted by cutting the wiring.

In accordance with the present invention, a manufacturing method of a semiconductor device including an antenna having a large loop and a small-loop group which is connected to the large loop can be provided wherein the inductance of the antenna is adjusted by cutting the large loop.

A plurality of elements is connected in series and a part thereof is connected to a wiring in parallel, so that a structure capable of changing a characteristic value of the element after the formation of the element can be provided.

In order to change the characteristic value of the element after the formation of the element, the wiring is cut by laser cutting or the like.

Particularly in a semiconductor device using a thin film, it is preferable to use laser cutting that enables cutting even after, for example, the formation of an interlayer insulating film or after the sealing.

In the case where a diode is used, the width of a secondary diode, in the direction which is vertical to the direction current flows is smaller than the width of a primary diode, in the direction which is vertical to the direction current flows, thereby contributing to sophistication of a semiconductor device and finely adjusting the threshold voltage or the current value.

The serially-connected structure described above can be applied not only to a diode but also to an antenna or another element.

BRIEF DESCRIPTION OF DRAWINGS

FIG. 3 is a graph showing an example of characteristics of a serially-connected diode group.

BEST MODE FOR CARRYING OUT THE INVENTION

Figure 1A:
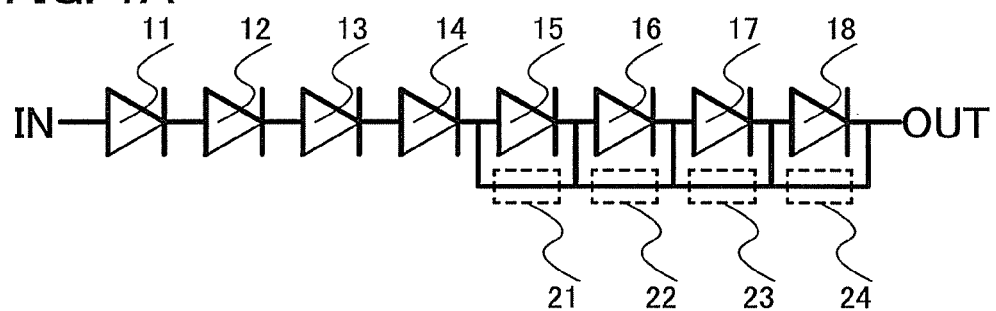
FIGS. 1A to 1D each illustrate an example of a serially-connected diode group.

Embodiments of the present invention will be described in detail using drawings.

It is easily understood by those skilled in the art that the mode and detail of the present invention can be variously changed unless departing from the scope and spirit of the present invention.

Therefore, the present invention is not interpreted as being limited to the description of the embodiments described below.

In structures to be given below, the same portions or portions having similar functions are denoted by the same reference numerals throughout the drawings, and explanation thereof is not repeated.

The embodiments below can be combined as appropriate to be implemented.

Embodiment 1

In this embodiment, an element including a plurality of diodes will be described using FIGS. 1A to 1D, 2A to 2D, and FIG. 3.

FIGS. 1A to 1D each illustrate a structure in which a plurality of diodes is connected in series and a part of the plurality of elements is connected to a wiring in parallel.

In FIG. 1A, a diode is illustrated, and a diode-connected transistor, a PIN diode, a PN diode, a Schottky diode, or the like can be used as the diode.

Figure 1B:
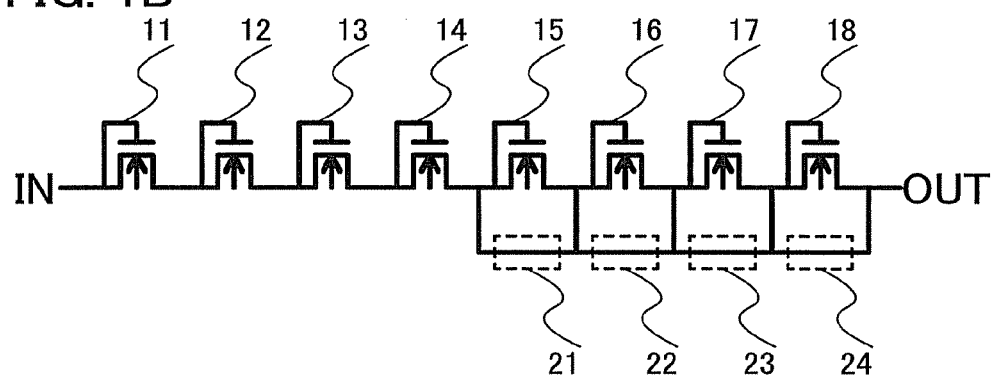

FIG. 1B illustrates the structure in which an n-channel transistor is diode-connected.

Figure 1C:
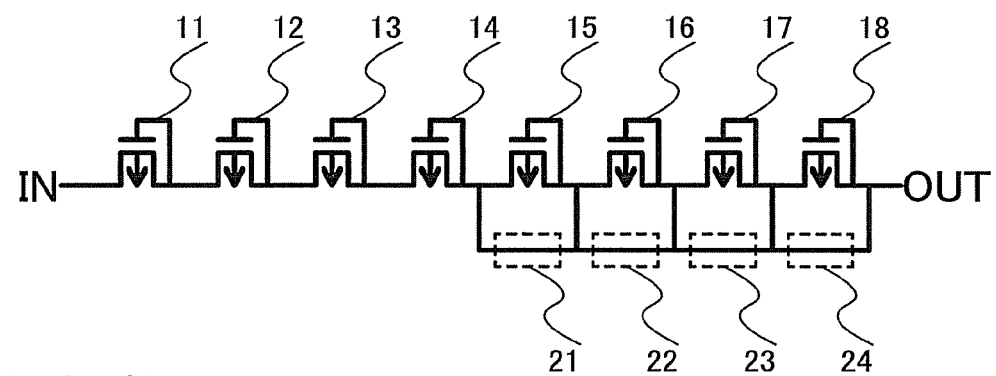

FIG. 1C illustrates the structure in which a p-channel transistor is diode-connected.

Figure 1D:
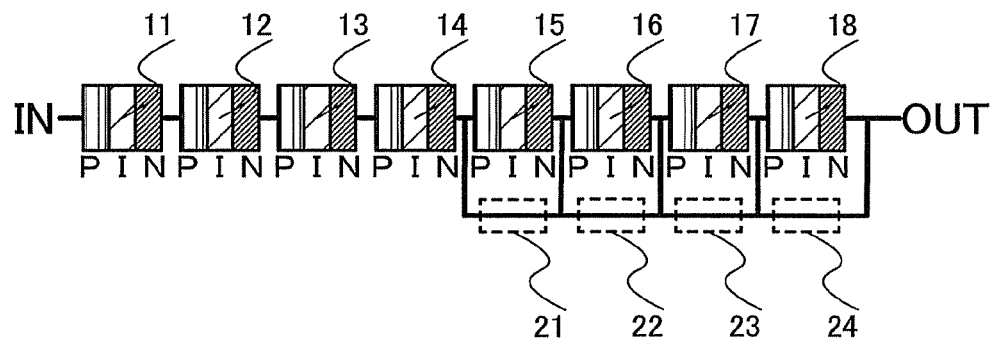

In FIG. 1D, a PIN diode is illustrated.

Note that although eight diodes are connected in series in this embodiment, the number of diodes in the present invention is not limited to eight.

In FIGS. 1A to 1D, diodes 11 to 18 are connected in series.

Reference symbol IN denotes an input terminal of the element including a plurality of diodes and OUT denotes an output terminal of the element including a plurality of diodes.

The input terminal IN is electrically connected to an input terminal of the diode 11.

The output terminal OUT is electrically connected to an output terminal of the diode 18.

Here, the diodes 11 to 14 are referred to as primary diodes and the diodes 15 to 18 are referred to as secondary diodes.

In addition, the diodes 15 to 18, which are the secondary diodes, are connected to their respective wirings which are surrounded by dotted line portions 21 to 24, in parallel.

The secondary diode and the wiring are connected in parallel, whereby a current flows preferentially into the wiring, so that the secondary diode does not function.

To the contrary, as shown in FIGS. 2A to 2D, cutting of the wiring of the dotted line portion has the secondary diode functioning.

Figure 2A:
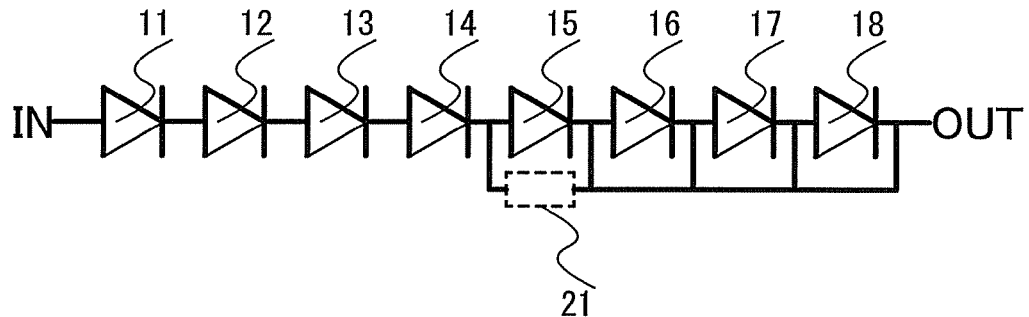
FIGS. 2A to 2D each illustrate an example of a serially-connected diode group.

For example, the wiring of the dotted line portion 21 is cut as shown in FIG. 2A, thereby having the diode 15 functioning, so that the number of diodes being functioned is five.

Figure 2B:
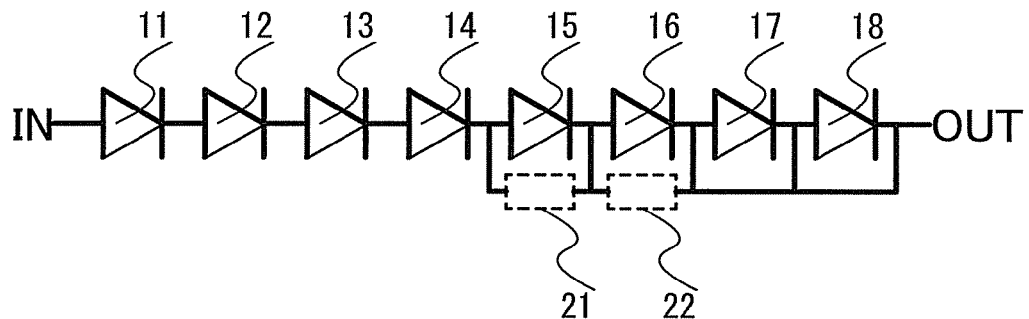

Furthermore, the wiring of the dotted line portion 22 is cut as shown in FIG. 2B, thereby having the diode 16 functioning in addition to the diode 15, so that the number of diodes being functioned is six.

Figure 2C:
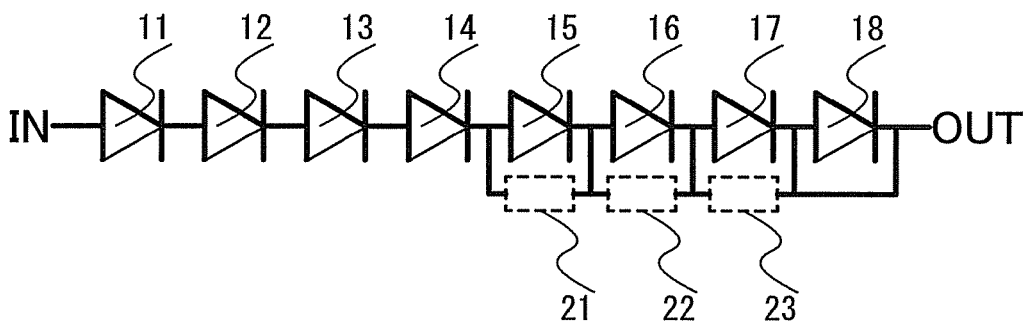

Furthermore, the wiring of the dotted line portion 23 is cut as shown in FIG. 2C, thereby having the diode 17 functioning in addition to the diodes 15 and 16, so that the number of diodes being functioned is seven.

Figure 2D:
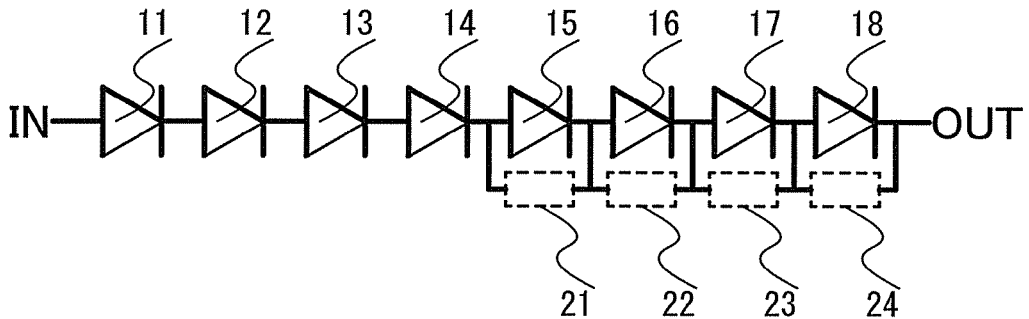

Furthermore, the wiring of the dotted line portion 24 is cut as shown in FIG. 2D, thereby having the diode 18 functioning in addition to the diodes 15, 16, and 17, so that the number of diodes being functioned is eight.

Although the cutting of the wiring is performed starting from the left in FIGS. 2A to 2D, the cutting is not necessarily performed in this order shown in FIGS. 2A to 2D because the cutting of the wiring has the secondary diode which has been connected to the same wiring in parallel until the cutting functioning.

Here, as examples of the method for cutting the wiring, various kinds of methods such as laser cutting, cutting using scissors, cutting using a cutter, and cutting using a needle can be applied.

However, the usage of scissors, a cutter, a needle, or the like may cause break of a circuit or an interlayer insulating film which is disposed around the wiring that is to be cut, due to stress at the time of the cutting.

Further, when the cutting using scissors, a cutter, a needle, or the like is performed after the sealing, the sealing is broken.

Therefore, laser cutting is more preferable in that cutting can be performed without causing stress breakdown or sealing breaking.

In particular, laser cutting is preferable in a semiconductor device using a thin film.

This is because laser cutting enables the cutting of only the wiring selectively, even in the case where the wiring is covered with an interlayer insulating film, a sealing material, or the like.

Note that a material for forming an interlayer insulating film, such as polyimide, a material for sealing, such as prepreg or epoxy, or the like can be cut by a YAG laser having a wavelength of 355 nm, but cannot be cut by a YAG laser having a wavelength of 1064 nm, a YAG laser having a wavelength of 532 nm, a YLF laser having a wavelength of 1047 nm, or the like.

Therefore, in order to selectively cut only the wiring without breaking the interlayer insulating film, it is preferable to use a YAG laser having a wavelength of 1064 nm, a YAG laser having a wavelength of 532 nm, an YLF laser having a wavelength of 1047 nm, or the like. In the case where it does not matter if the interlayer insulating film is broken, any kind of laser can be used.

In FIG. 3, the change of the threshold voltage of an element including a plurality of diodes in accordance with the increase of the number of diodes is shown.

The horizontal axis in FIG. 3 indicates a voltage V and the vertical axis indicates a current I.

In addition, reference symbols m, m+1, m+2, m+3, and m+4 (m is natural number) each indicate the number of diodes.

In addition, reference symbols $V_m$, $V_{m+1}$, $V_{m+2}$, $V_{m+3}$, and $V_{m+4}$ indicate their respective threshold voltages of the elements each including a plurality of diodes when the numbers of diodes are m, m+1, m+2, m+3, and m+4.

From FIG. 3, it is found that the threshold voltage of the element including a plurality of diodes is increased as the number of diodes is increased.

In this manner, the wiring is cut, thereby having the secondary diode functioning, so that the threshold voltage of the element including a plurality of diodes can be adjusted.

Further, in the case where the primary diode is broken to cause current leakage, the element including a plurality of diodes can be repaired by having the secondary diode functioning.

In particular, since the gate insulating film in a thin film transistor tends to be broken even by a low voltage, the repair process is important in the case of a diode using a thin film transistor.

This embodiment can be combined with any other embodiment in this specification to be implemented.

Embodiment 2

In this embodiment, top views and bottom views of elements each corresponding to FIGS. 1A to 1D, 2A to 2D, and FIG. 3, in which diodes each using an n-channel thin film transistor are connected in series will be described.

Figure 4:
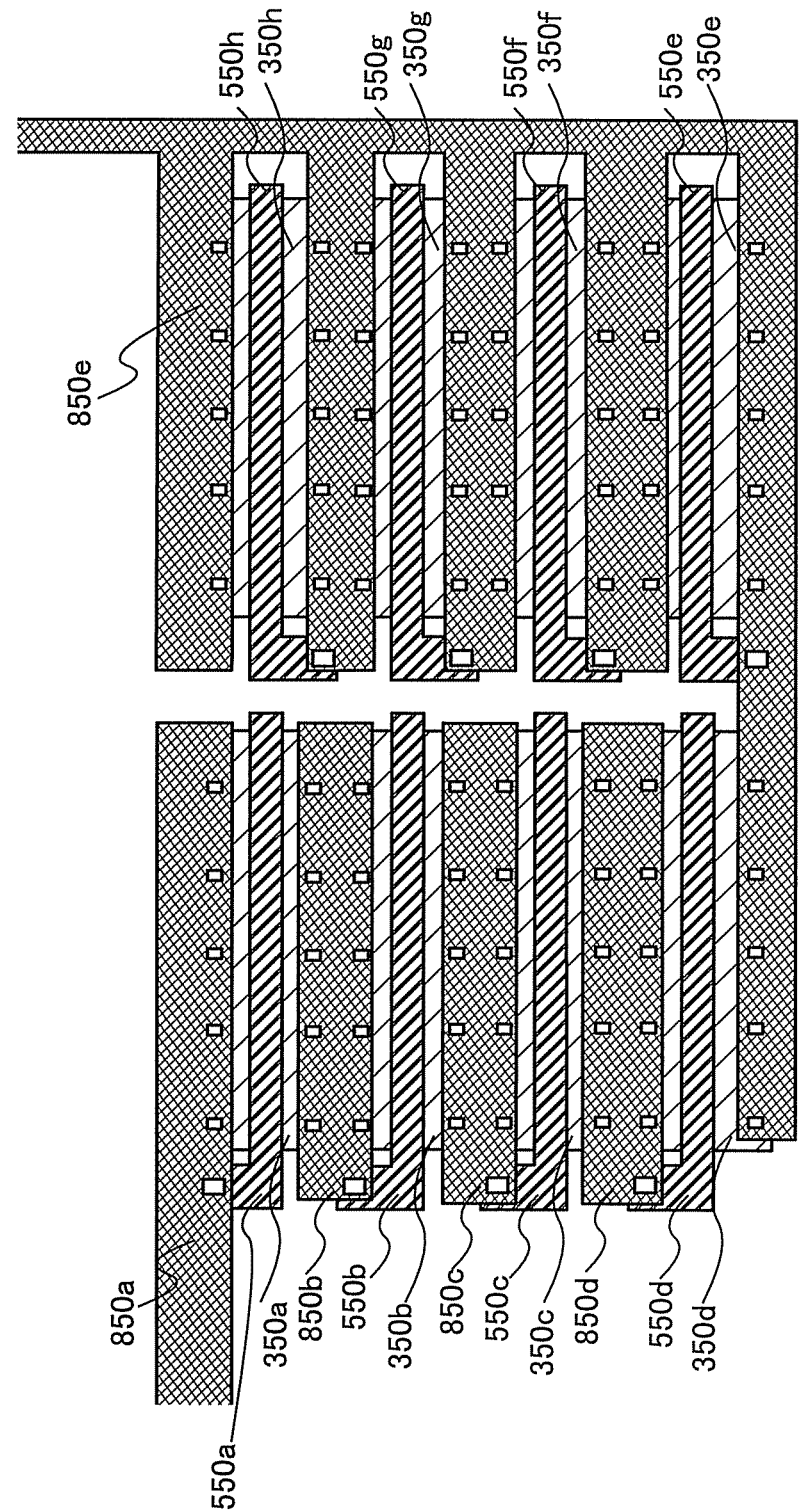
FIG. 4 is an example of a top view of a serially-connected diode group.
Figure 5:
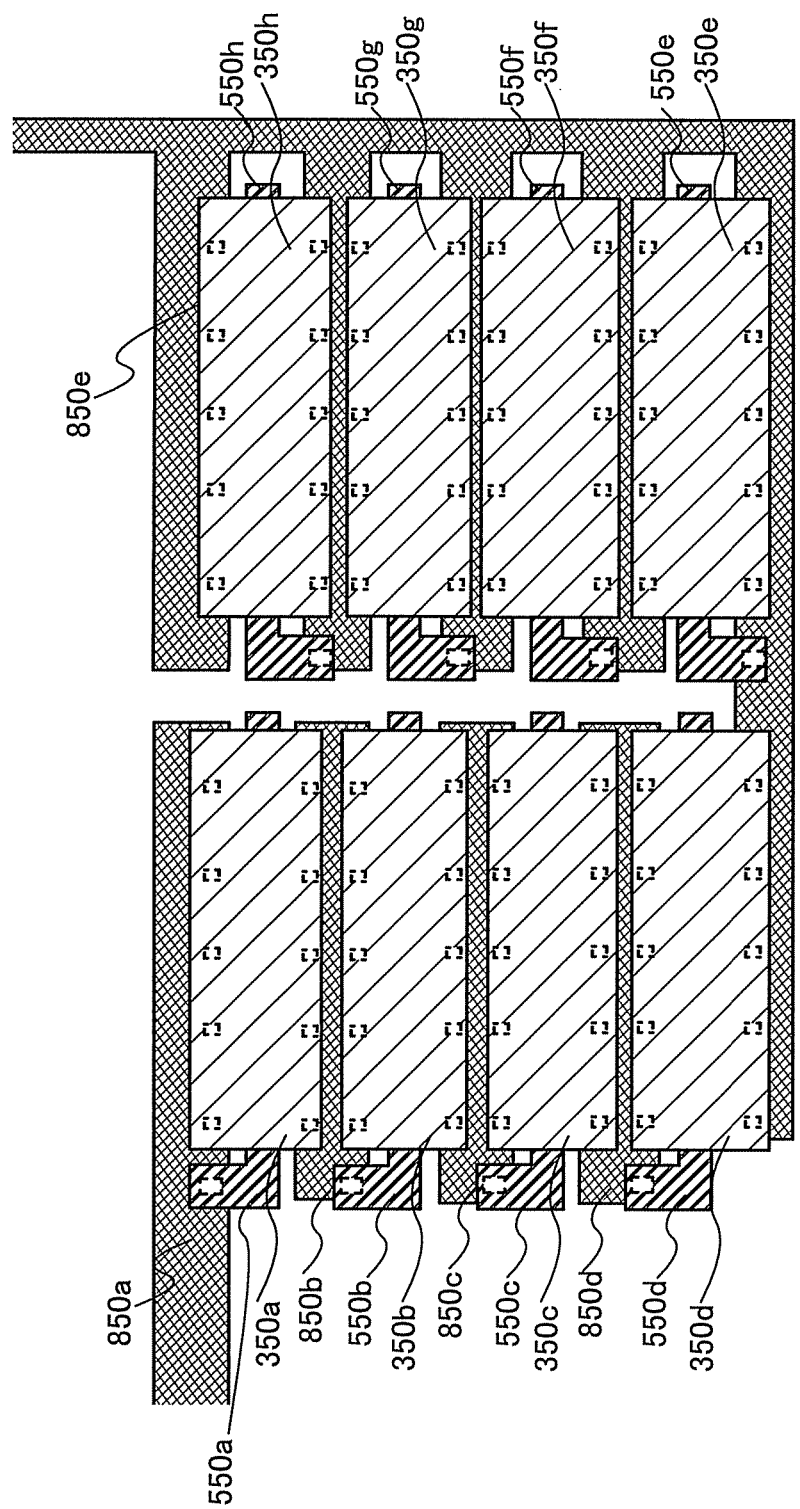
FIG. 5 is an example of a bottom view of a serially-connected diode group.
Figure 6:
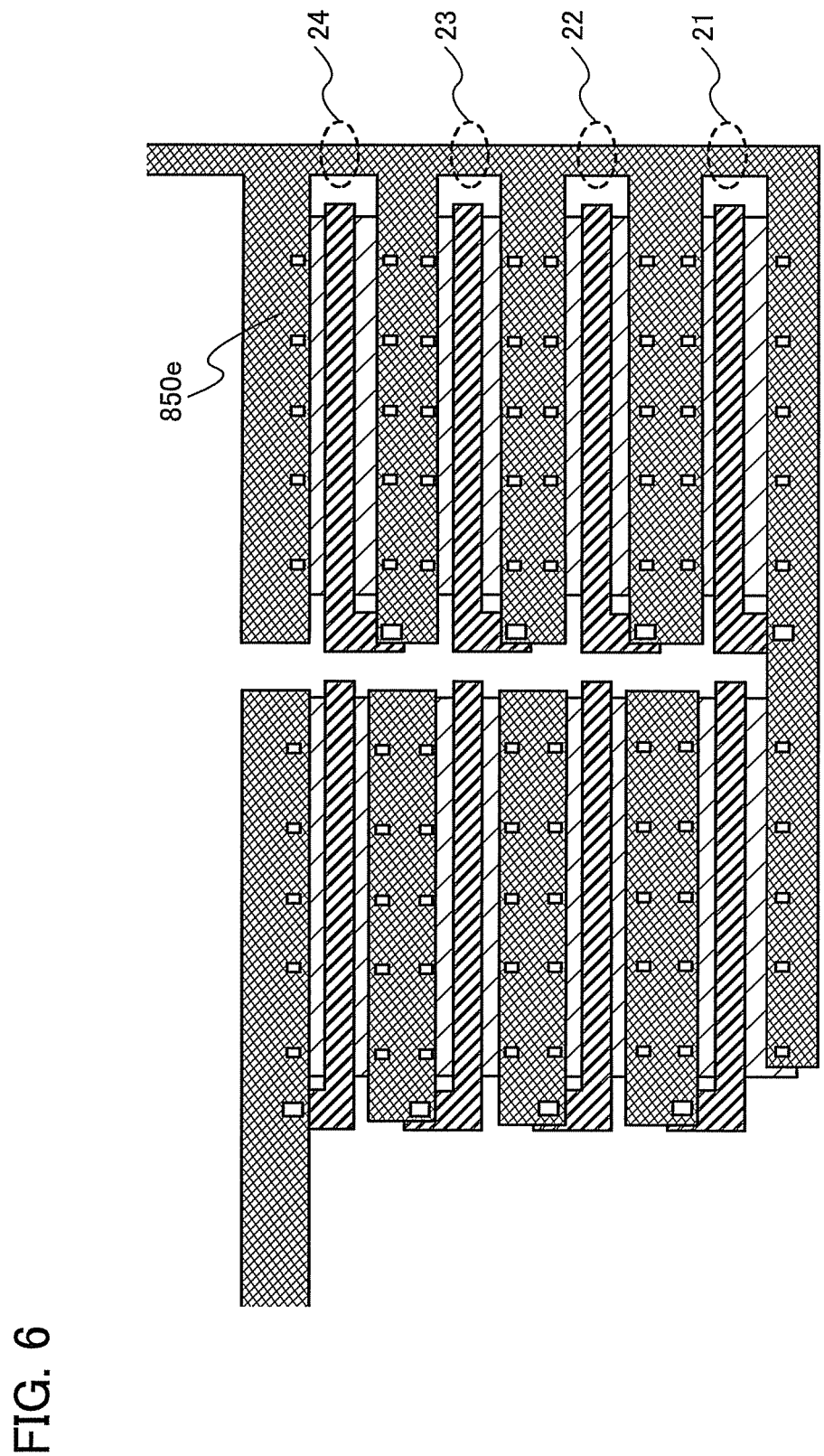
FIG. 6 is an example of a top view of a serially-connected diode group.
Figure 7:
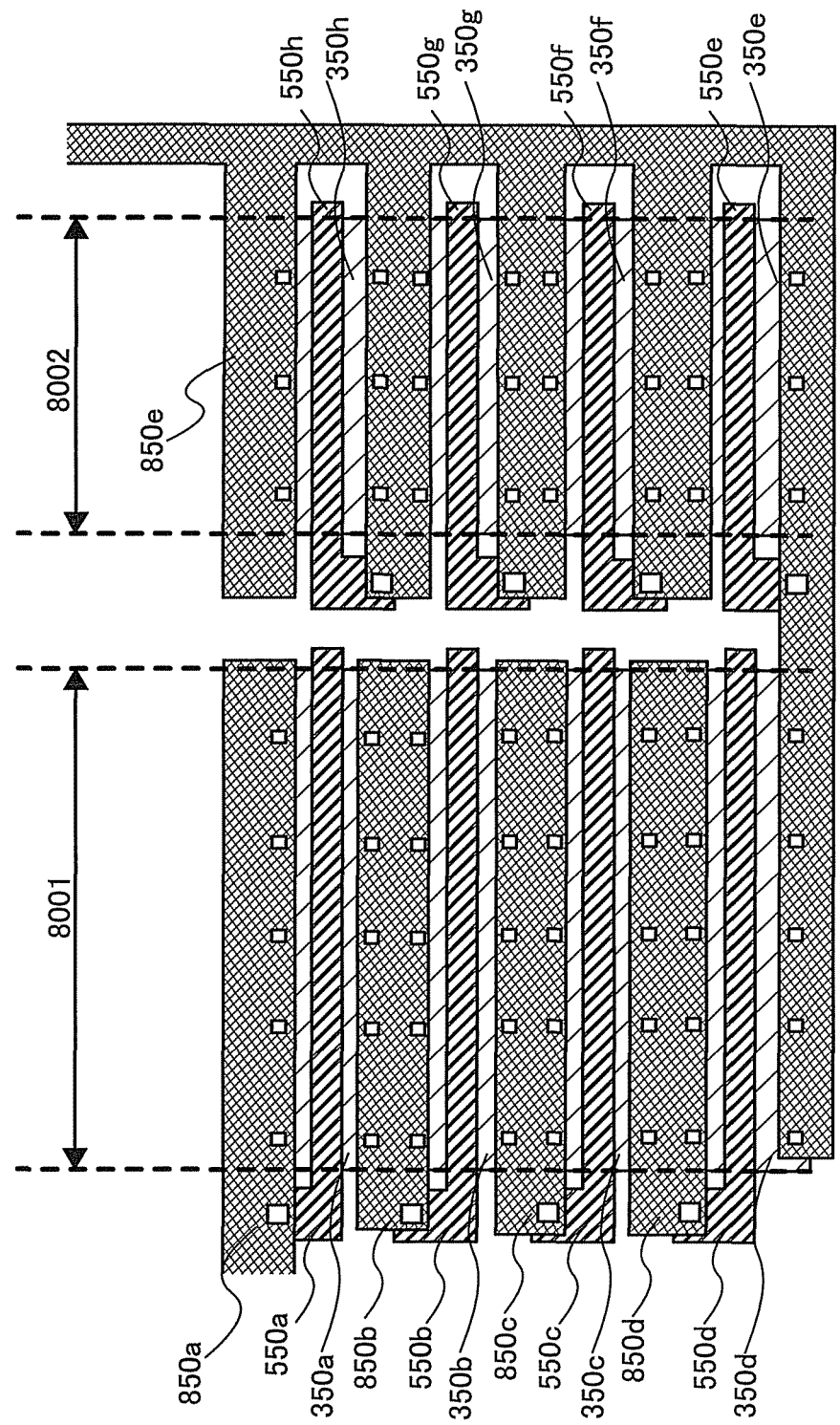
FIG. 7 is an example of a top view of a serially-connected diode group.
Figure 8:
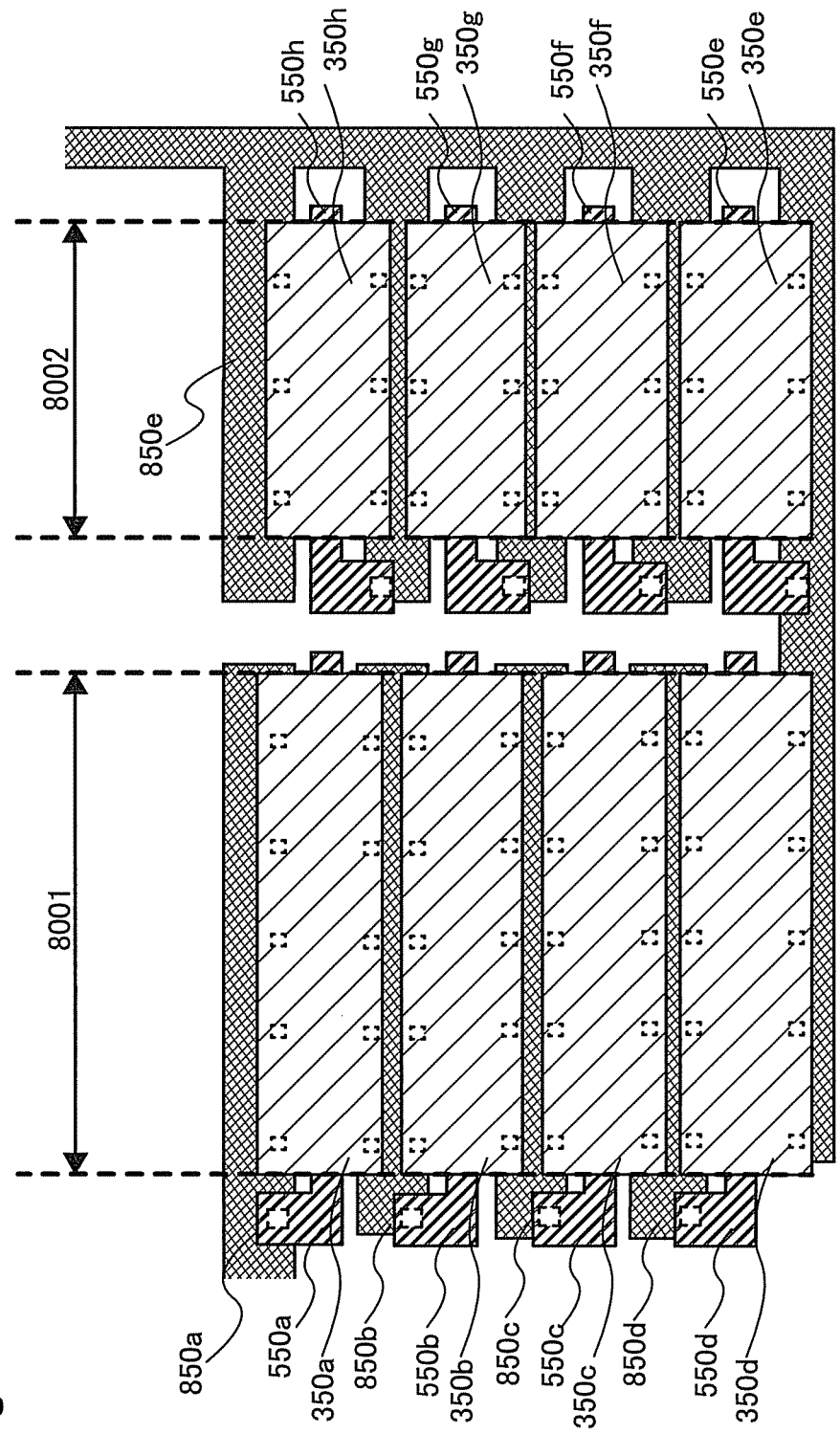
FIG. 8 is an example of a bottom view of a serially-connected diode group.

FIGS. 4, 6, 7, and 9 are top views and FIGS. 5 and 8 are bottom views.

Although any thin film transistor shown in FIGS. 4 to 9 is a top-gate type thin film transistor, a bottom-gate type thin film transistor can alternatively be used.

Any acceptable switching element other than a thin film transistor can be used.

The elements shown in FIGS. 4 to 9 each include semiconductor layers 350a to 350h, gate electrodes 550a to 550h, and wirings 850a to 850e.

Figure 9:
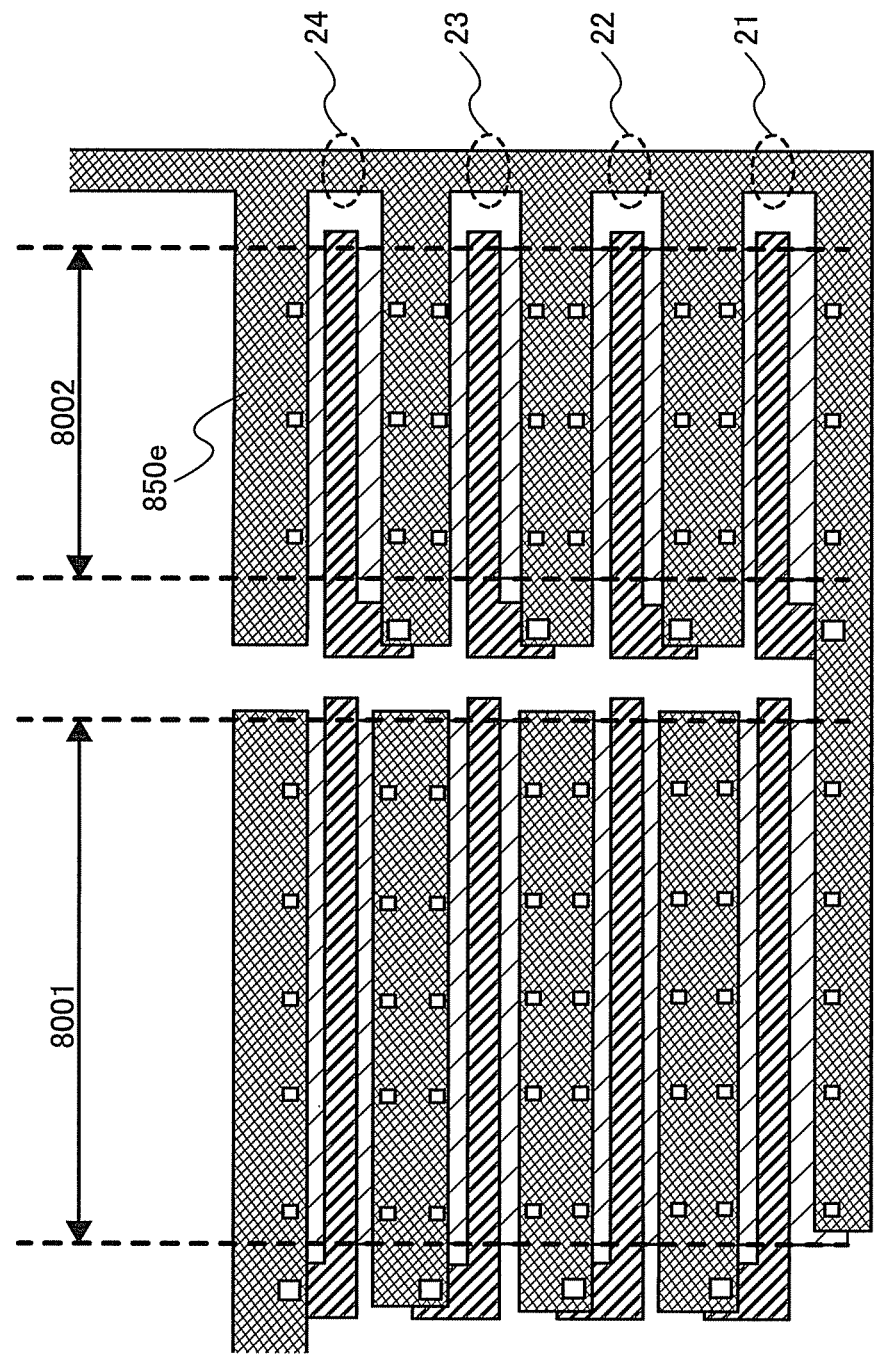
FIG. 9 is an example of a top view of a serially-connected diode group.

Further, dotted line portions 21 to 24 shown in FIGS. 6 and 9 correspond to their respective dotted line portions 21 to 24 shown in FIGS. 1A to 1D, 2A to 2D, and FIG. 3.

The portion which includes the semiconductor layers 350a to 350d, the gate electrodes 550a to 550d, and the wirings 850a to 850d corresponds to the primary diode portion in FIGS. 1A to 1D, 2A to 2D, and FIG. 3.

Further, the portion which includes the semiconductor layers 350e to 350h, the gate electrodes 550e to 550h, and the wiring 850e corresponds to the secondary diode portion in FIGS. 1A to 1D, 2A to 2D, and FIG. 3.

The gate electrode is disposed to overlap with the semiconductor layer with a gate insulating film interposed therebetween.

Further, each of a source region and a drain region of the semiconductor layer is electrically connected to the wiring through a contact hole formed in an interlayer insulating film.

Further, the gate electrode is electrically connected to the wiring.

Here, the element shown in FIGS. 4 to 6 is formed such that respective channel widths (each channel width is the width in the direction which is vertical to the direction current flows) of the primary diode and the secondary diode are equal to each other.

Here, the element shown in FIGS. 7 to 9 is formed such that respective channel widths (each channel width is the width in the direction which is vertical to the direction current flows) of the primary diode and the secondary diode are different from each other.

In specific, the element shown in FIGS. 7 to 9 is formed such that a channel width 8002 of the secondary diode is smaller than a channel width 8001 of the primary diode.

By forming the element shown in FIGS. 7 to 9 such that the channel width 8002 of the secondary diode is smaller than the channel width 8001 of the primary diode, the area of the secondary diode can be decreased, which contributes to sophistication of a semiconductor device.

Furthermore, the decrease of the channel width of the secondary diode makes the amount of current which flows into the secondary diode small, so that the amount of correction of the threshold voltage or the current value by cutting the wiring and having the secondary diode functioning is small.

The small amount of correction of the threshold voltage or the current value enables voltage adjustment with respect to the threshold voltage to be finely performed.

Although an n-channel thin film transistor is used in this embodiment, the same or substantially the same effect as the effect in this embodiment can be obtained without being limited to the kind of a transistor, by designing the element shown in FIGS. 7 to 9 such that the width of the secondary diode, in the direction which is vertical to the direction current flows is smaller than that of the primary diode.

That is, the width of a secondary diode, in the direction which is vertical to the direction current flows is smaller than the width of a primary diode, in the direction which is vertical to the direction current flows, thereby contributing to sophistication of a semiconductor device and finely adjusting the threshold voltage or the current value.

This embodiment can be combined with any other embodiment in this specification to be implemented.

Embodiment 3

In this embodiment, one example of a manufacturing method of a semiconductor device will be described.

Figure 10:
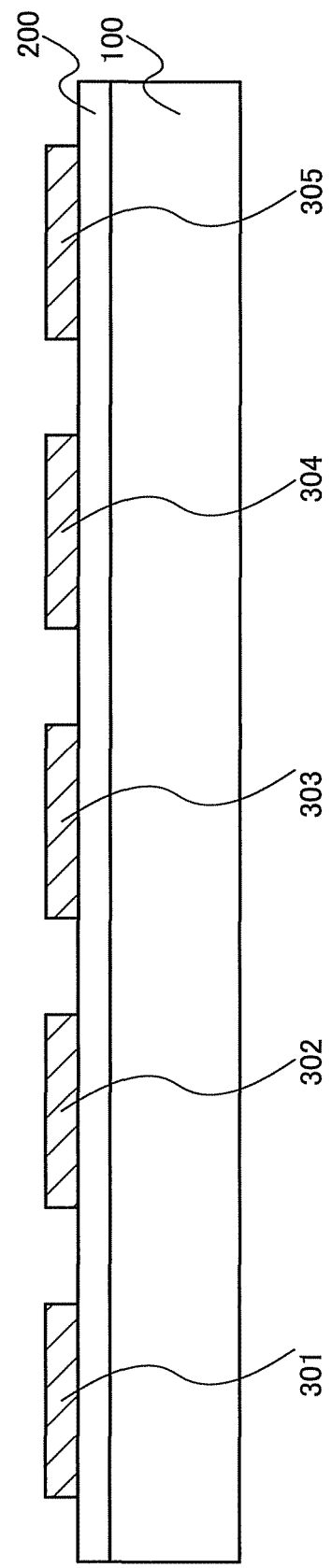
FIG. 10 is an example of a cross-sectional view showing a manufacturing method of a semiconductor device.

First, a base insulating film 200 is formed over a substrate 100, and island-shaped semiconductor layers 301 to 305 are formed over the base insulating film 200 (FIG. 10).

The island-shaped semiconductor layer 301 is a semiconductor layer used in an n-channel thin film transistor.

The island-shaped semiconductor layer 302 is a semiconductor layer used in a p-channel thin film transistor.

The island-shaped semiconductor layer 303 is a semiconductor layer used in a capacitor.

The island-shaped semiconductor layer 304 is a semiconductor layer used in a PIN diode.

The island-shaped semiconductor layer 305 is a semiconductor layer used in a resistor.

Although the method in which five kinds of elements are manufactured at the same time is described as one example in this embodiment, one or some of the five kinds of elements may be manufactured (for example, only an n-channel thin film transistor, a p-channel thin film transistor, and a capacitor are manufactured).

In the case where laser cutting is performed from the back-surface side of the substrate 100, it is necessary to recognize a laser cutting portion by eyes and to transmit laser light, and therefore, it is preferable to use a light-transmissive substrate as the substrate 100.

In the case where laser cutting is performed from the front-surface side of the substrate 100, the substrate 100 does not necessarily have light-transmissive properties with respect to visible lights.

As a light-transmissive substrate, a glass substrate, a quartz substrate, a plastic substrate, or the like can be used.

As a substrate which does not have light-transmissive properties, a metal substrate or the like can be used.

As the base insulating film 200, a silicon oxide film, a silicon nitride film, a silicon oxide film containing nitrogen, a silicon nitride film containing oxygen, or the like can be used.

The base insulating film 200 is either a single layer or a stacked layer.

The base insulating film 200 can be formed by a CVD method, a sputtering method, or the like.

It is preferable that the thickness of the base insulating film 200 be 10 nm to 500 nm.

The formation of the base insulating film 200 may be omitted.

Like the material of the substrate 100, in the case where laser cutting is performed from the back-surface side of the substrate 100, it is necessary to recognize a laser cutting portion by eyes and to transmit laser light, and therefore, it is preferable to use a light-transmissive insulating film as the base insulating film 200.

Note that a silicon oxide film, a silicon nitride film, a silicon oxide film containing nitrogen, a silicon nitride film containing oxygen, and the like are examples of the light-transmissive insulating film.

As a material of each of the island-shaped semiconductor layers 301 to 305, silicon, silicon germanium, an oxide semiconductor, an organic semiconductor, or the like can be used.

The crystal state of amorphous, microcrystalline, polycrystalline, single crystalline, or the like can be used for the island-shaped semiconductor layers 301 to 305.

The island-shaped semiconductor layers 301 to 305 each can be formed by a CVD method, a sputtering method, a vapor deposition method, or the like.

It is preferable that the thickness of each of the island-shaped semiconductor layers 301 to 305 be 10 nm to 1000 nm.

When a wiring or a gate wiring is cut, a part of the island-shaped semiconductor layers 301 to 305, which overlaps with the cutting portion, may be cut to cause element breaking.

Therefore, it is preferable that each of the island-shaped semiconductor layers 301 to 305 is disposed so as not to overlap with the cutting portion.

Figure 11:
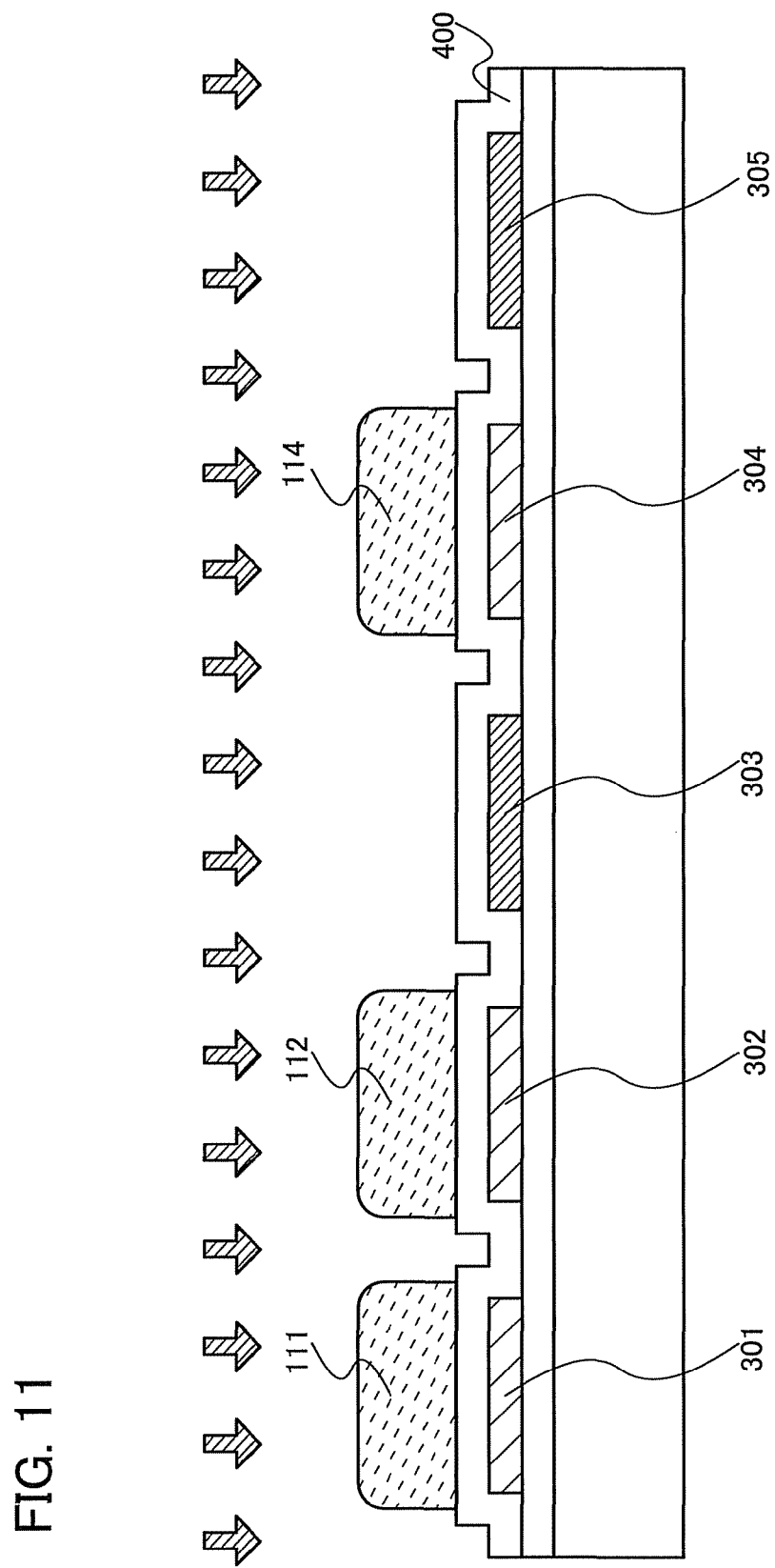
FIG. 11 is an example of a cross-sectional view showing a manufacturing method of a semiconductor device.

Next, the gate insulating film 400 is formed over the island-shaped semiconductor layers 301 to 305, masks 111, 112, and 114 are formed over the gate insulating film 400, and an impurity containing an impurity element which imparts a conductivity type is added into the island-shaped semiconductor layers 303 and 305 with the masks 111, 112, and 114 (FIG. 11).

After the addition of the impurity, the masks 111, 112, and 114 are removed.

Note that the mask 111 is formed so as to overlap with the island-shaped semiconductor layer 301.

The mask 112 is formed so as to overlap with the island-shaped semiconductor layer 302.

The mask 114 is formed so as to overlap with the island-shaped semiconductor layer 304.

As the gate insulating film 400, a silicon oxide film, a silicon nitride film, a silicon oxide film containing nitrogen, a silicon nitride film containing oxygen, or the like can be used.

The gate insulating film 400 is either a single layer or a stacked layer.

The gate insulating film 400 can be formed by a CVD method, a sputtering method, or the like.

It is preferable that the thickness of the gate insulating film 400 be 10 nm to 200 nm.

Like the material of the substrate 100, in the case where laser cutting is performed from the back-surface side of the substrate 100, it is necessary to recognize a laser cutting portion by eyes and to transmit laser light, and therefore, it is preferable to use a light-transmissive insulating film as the gate insulating film 400.

Note that a silicon oxide film, a silicon nitride film, a silicon oxide film containing nitrogen, a silicon nitride film containing oxygen, and the like are examples of the light-transmissive insulating film.

As the masks 111, 112, and 114, an organic material such as a photoresist can be used.

Instead of the method using a photoresist, a method of forming a mask, in which an organic material such as polyimide or acrylic is applied by an ink-jet method, or the like may be used.

As the impurity element which imparts a conductivity type to a semiconductor, there are donor elements (N-type) and acceptor elements (P-type).

As examples of the donor elements (N-type), there are phosphorus, arsenic, and the like.

As examples of the acceptor elements (P-type), there are boron and the like.

In the case where the addition is performed using an ion implantation method in which mass separation is performed, either a donor element or an acceptor element can be added by itself.

In the case where the addition is performed using a thermal diffusion method, an ion doping method in which mass separation is not performed, or the like, phosphine (phosphorous), diborane (boron), or the like can be used.

Note that the island-shaped semiconductor layer 303 is a part of a capacitor and the island-shaped semiconductor layer 304 is a part of a resistor, and therefore, the element which is added is either a donor element (N-type) or an acceptor element (P-type).

With respect to the adjustment of the resistance value, the adjustment of the resistance value of a donor element is relatively easier than that of an acceptor element, and therefore, it is preferable to add the donor element.

Figure 12:
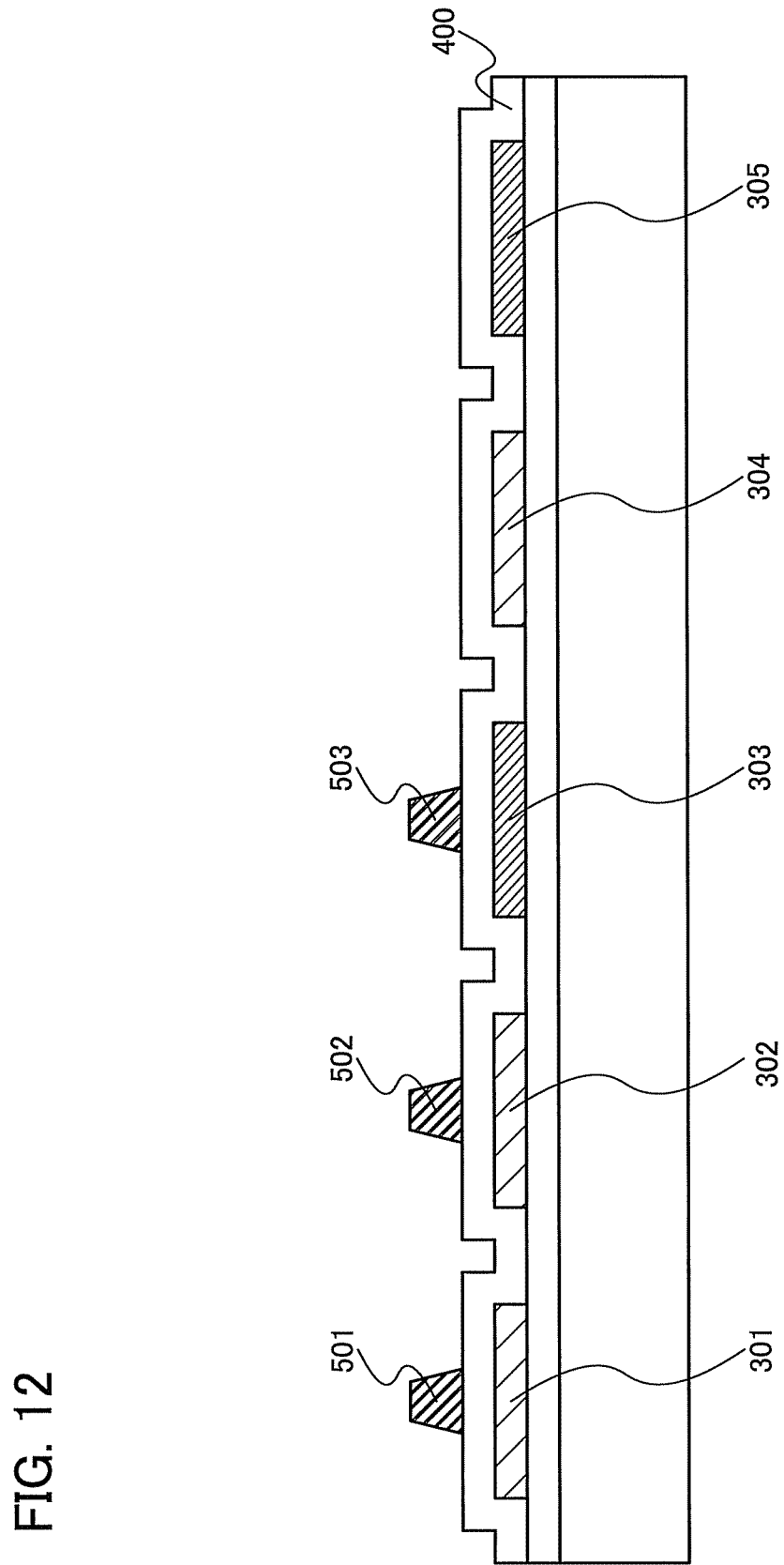
FIG. 12 is an example of a cross-sectional view showing a manufacturing method of a semiconductor device.

Next, gate electrodes 501 to 503 and a gate wiring are formed over the gate insulating film 400 (FIG. 12).

Note that the gate electrode 501 is formed so as to overlap with the island-shaped semiconductor layer 301.

The gate electrode 502 is formed so as to overlap with the island-shaped semiconductor layer 302.

The gate electrode 503 is formed so as to overlap with the island-shaped semiconductor layer 303.

As a material of each of the gate electrodes 501 to 503 and the gate wiring, tungsten, molybdenum, aluminum, titanium, silicon, or the like can be used.

The gate electrodes 501 to 503 and the gate wiring are each either a single layer or a stacked layer.

The gate electrodes 501 to 503 and the gate wiring can be each formed by a CVD method, a sputtering method, or the like.

It is preferable that their respective thicknesses of the gate electrodes 501 to 503 and the gate wiring be 100 nm to 1000 nm.

When a wiring is cut, a part of the gate electrodes 501 to 503 or the gate wiring, which overlaps with the cutting portion, may be cut to cause short-circuiting.

Therefore, it is preferable that each of the gate electrodes 501 to 503 and the gate wiring is disposed so as not to overlap with the cutting portion.

However, in the case where the wiring is cut, the wiring is disposed so as to overlap with the cutting portion.

Figure 13:
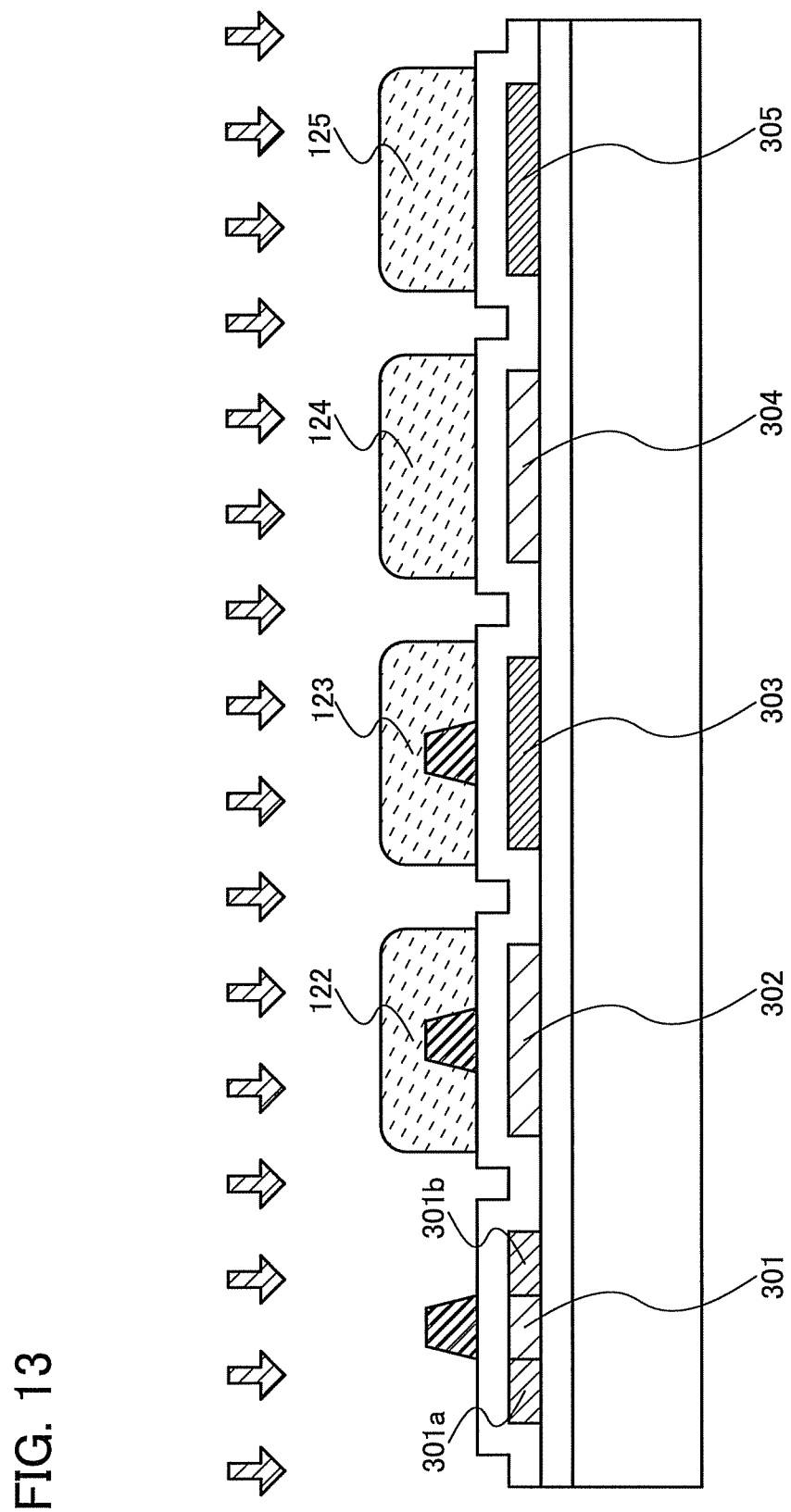
FIG. 13 is an example of a cross-sectional view showing a manufacturing method of a semiconductor device.

Next, masks 122 to 125 are formed, and a donor element (N-type) is added into regions 301a and 301b in the island-shaped semiconductor layer 301 by using the masks 122 to 125 and the gate electrode 501 as masks (FIG. 13).

After the addition of the donor element (N-type), the masks 122 to 125 are removed.

As the masks and the donor element (N-type), the aforementioned masks and donor element (N-type) can be used.

Note that the mask 122 is formed so as to overlap with the island-shaped semiconductor layer 302.

The mask 123 is formed so as to overlap with the island-shaped semiconductor layer 303.

The mask 124 is formed so as to overlap with the island-shaped semiconductor layer 304.

The mask 125 is formed so as to overlap with the island-shaped semiconductor layer 305.

The regions 301a and 301b are positioned in the island-shaped semiconductor layer 301 so as not to overlap with the gate electrode 501.

Figure 14:
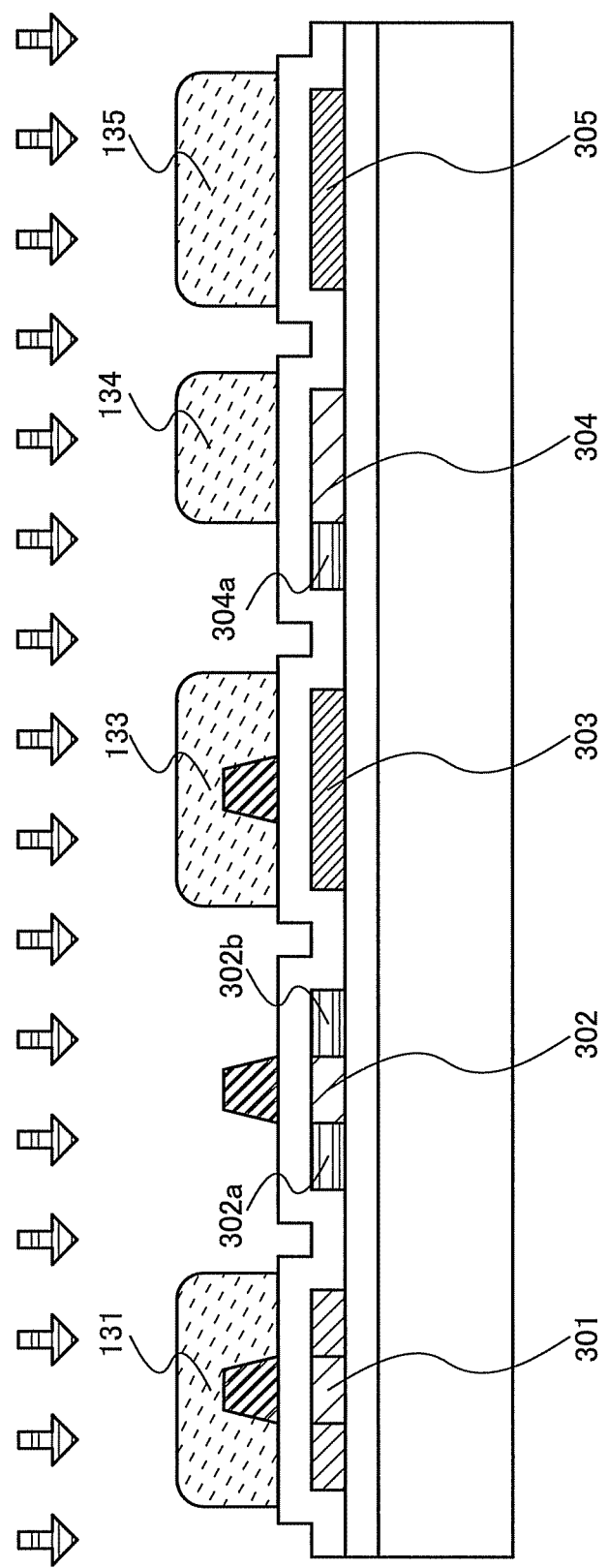
FIG. 14 is an example of a cross-sectional view showing a manufacturing method of a semiconductor device.

Next, masks 131, 133, 134, and 135 are formed, and an acceptor element (P-type) is added into regions 302a, 302b, and 304a by using the masks 131, 133, 134, and 135 and the gate electrode 502 as masks (FIG. 14).

After the addition of the acceptor element (P-type), the masks 131, 133, 134, and 135 are removed.

As the masks and the donor element (P-type), the aforementioned masks and donor element (P-type) can be used.

Note that the mask 131 is formed so as to overlap with the island-shaped semiconductor layer 301.

The mask 133 is formed so as to overlap with the island-shaped semiconductor layer 303.

The mask 134 is formed so as to overlap with the island-shaped semiconductor layer 304.

The mask 135 is formed so as to overlap with the island-shaped semiconductor layer 305.

The regions 302a and 302b are positioned in the island-shaped semiconductor layer 302 so as not to overlap with the gate electrode 502 and function as a source region and a drain region of a p-channel thin film transistor.

The region 304a is positioned to form a p-type impurity region of a PIN diode.

Figure 15:
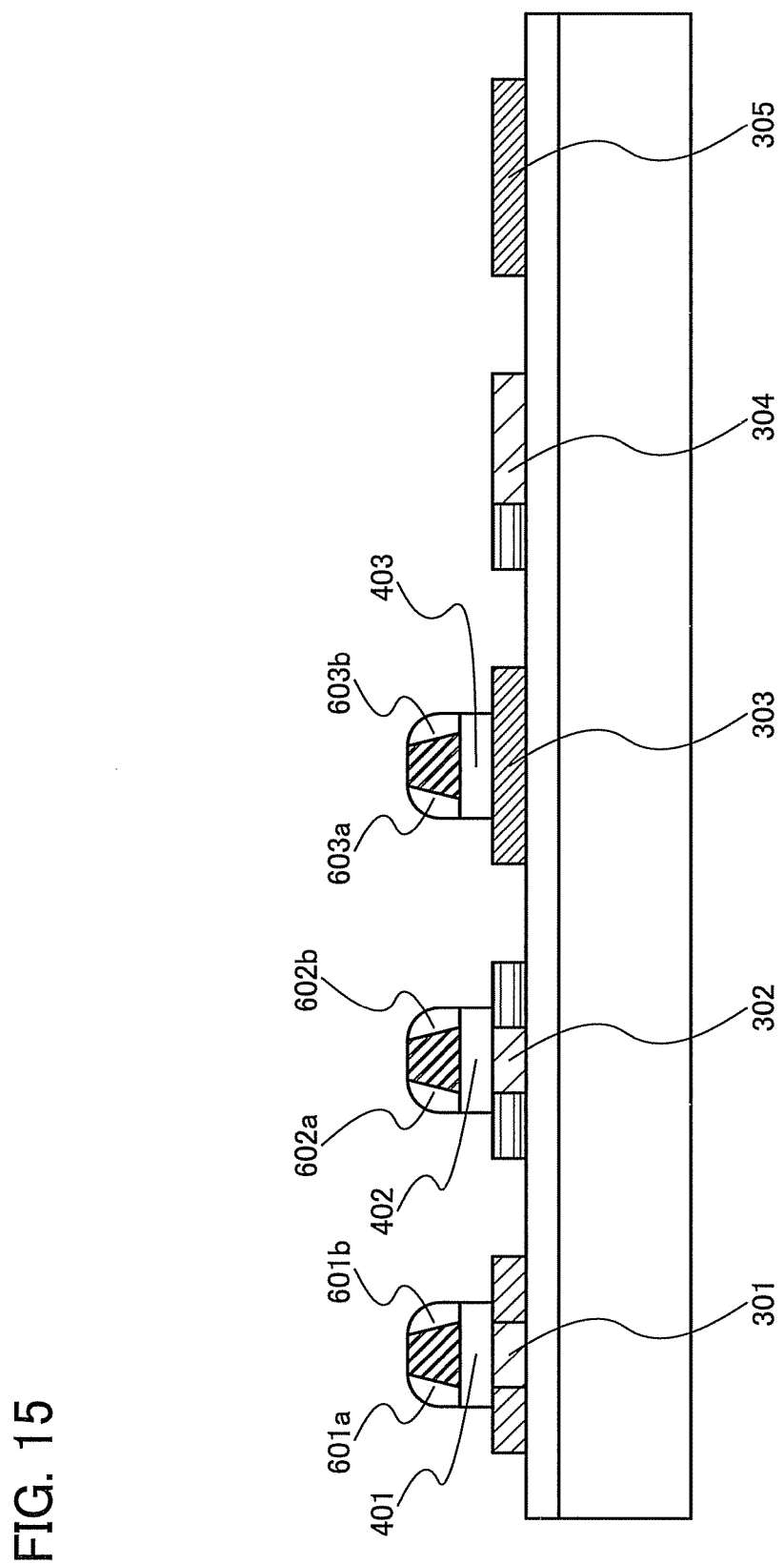
FIG. 15 is an example of a cross-sectional view showing a manufacturing method of a semiconductor device.

Next, an insulating film for forming a sidewall is provided to cover the gate electrodes 501 to 503 and the gate wiring, and the insulating film for forming a sidewall is etched back to form a sidewall on each side-wall of the gate electrodes 501 to 503 (FIG. 15).

Sidewalls 601a and 601b are formed on the side-wall of the gate electrode 501.

Sidewalls 602a and 602b are formed on the side-wall of the gate electrode 502.

Sidewalls 603a and 603b are formed on the side-wall of the gate electrode 503.

Further, the gate insulating film 400 is removed except in the positions which overlap with the gate electrodes, the gate wiring, and the sidewalls, so that gate insulating films 401 to 403 are formed.

Note that the gate insulating film 401 is formed so as to overlap with the island-shaped semiconductor layer 301.

The gate insulating film 402 is formed so as to overlap with the island-shaped semiconductor layer 302.

The gate insulating film 403 is formed so as to overlap with the island-shaped semiconductor layer 303.

The etching back of the insulating film for forming a sidewall may be performed using a condition by which the gate insulating film 400 is not removed.

As the insulating film for forming a sidewall, a silicon oxide film, a silicon nitride film, a silicon oxide film containing nitrogen, a silicon nitride film containing oxygen, or the like can be used.

The insulating film for forming a sidewall is either a single layer or a stacked layer.

The insulating film for forming a sidewall can be formed by a CVD method, a sputtering method, or the like.

The thickness of the insulating film for forming a sidewall is set to be larger than the height of each gate electrode.

Figure 16:
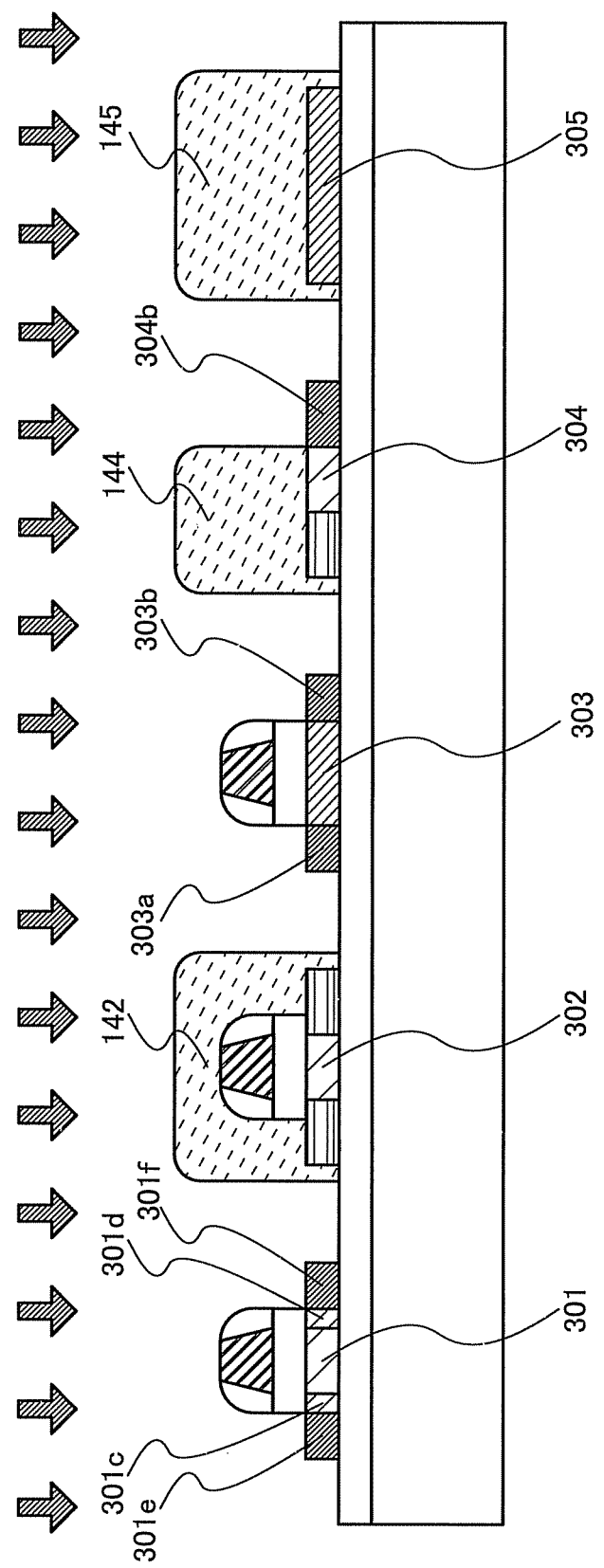
FIG. 16 is an example of a cross-sectional view showing a manufacturing method of a semiconductor device.

Next, masks 142, 144, and 145 are formed, and a donor element (N-type) is added into regions 301e, 301f, 304b, 303a, and 303b by using the masks 142, 144, and 145, the gate electrode 501, the sidewalls 601a and 601b, the gate electrode 503, and the sidewalls 603a and 603b as masks (FIG. 16).

After the addition of the donor element (N-type), the masks 142, 144, and 145 are removed.

As the masks and the donor element (N-type), the aforementioned masks and donor element (N-type) can be used.

Note that the mask 142 is formed so as to overlap with the island-shaped semiconductor layer 302.

The mask 144 is formed so as to overlap with the island-shaped semiconductor layer 304.

The mask 145 is fog lied so as to overlap with the island-shaped semiconductor layer 305.

Regions 301c and 301d are positioned to form LDD regions of an n-channel thin film transistor.

The regions 301e and 301f are positioned to form a source and drain regions of the n-channel thin film transistor.

The regions 303a and 303b are positioned to form contact regions of a capacitor.

The region 304b is positioned to form an n-type impurity region of a PIN diode.

Figure 17:
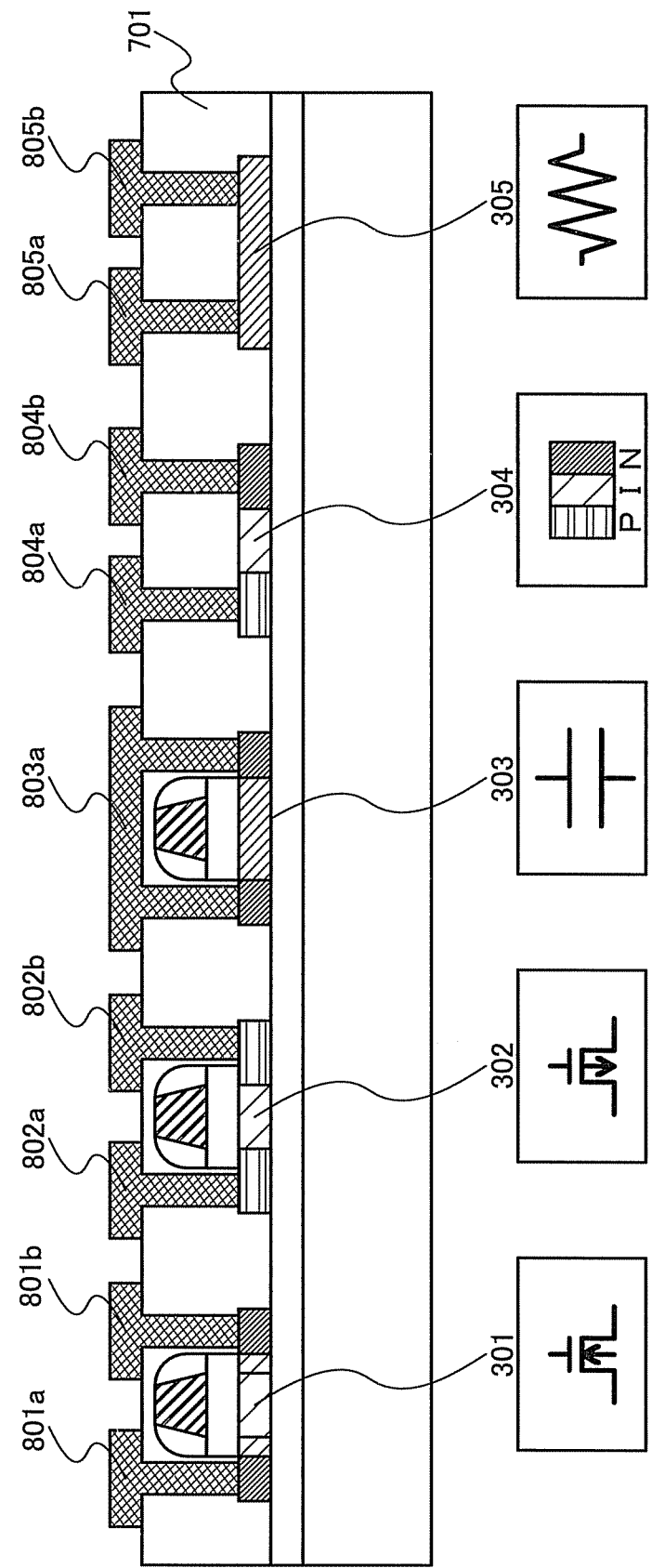
FIG. 17 is an example of a cross-sectional view showing a manufacturing method of a semiconductor device.
Figure 18:
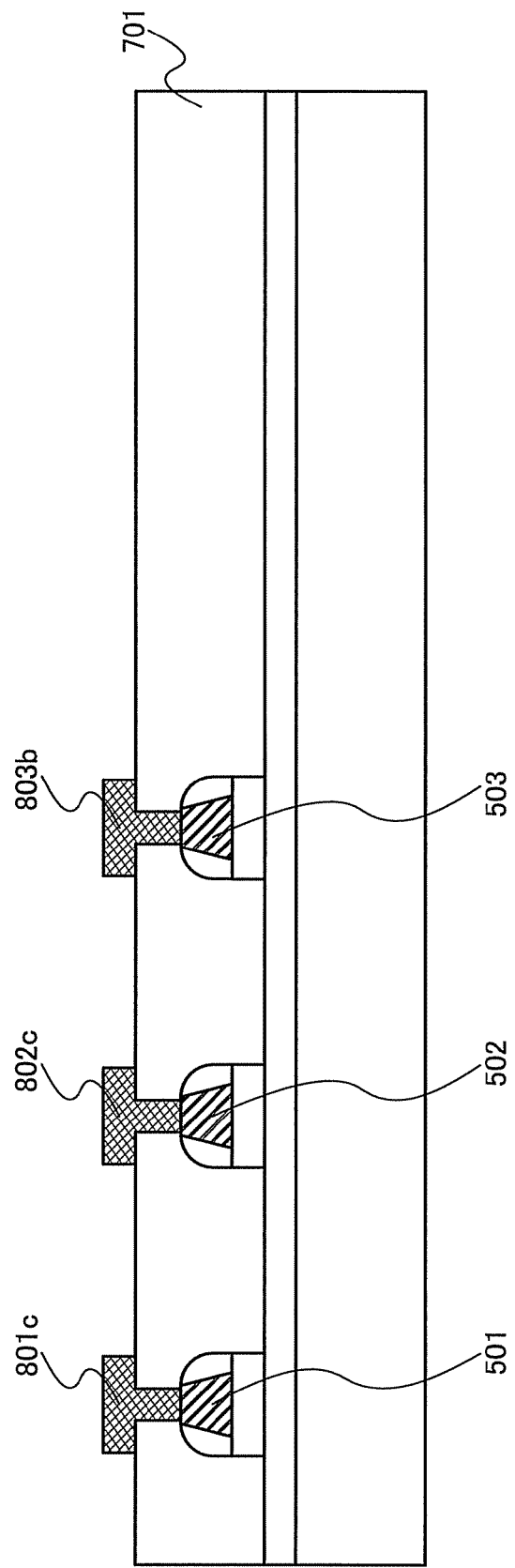
FIG. 18 is an example of a cross-sectional view showing a manufacturing method of a semiconductor device.

Next, an interlayer insulating film 701 which covers the island-shaped semiconductor layers, the gate electrodes, and the sidewalls is formed, contact holes are formed in the interlayer insulating film 701, and wirings 801a to 801c, 802a to 802c, 803a and 803b, 804a and 804b, and 805a and 805b are formed on the interlayer insulating film 701 (FIGS. 17 and 18).

FIG. 18 is a cross-sectional view at a different position from the position of FIGS. 10 to 17.

Note that the wiring 801a is electrically connected to one of the source and drain regions in the island-shaped semiconductor layer 301 through the contact hole.

The wiring 801b is electrically connected to the other of the source and drain regions in the island-shaped semiconductor layer 301 through the contact hole.

The wiring 801c is electrically connected to the gate electrode 501 through the contact hole.

The wiring 802a is electrically connected to one of the source and drain regions in the island-shaped semiconductor layer 302 through the contact hole.

The wiring 802b is electrically connected to the other of the source and drain regions in the island-shaped semiconductor layer 302 through the contact hole.

The wiring 802c is electrically connected to the gate electrode 502 through the contact hole.

The wiring 803a is electrically connected to the contact region in the island-shaped semiconductor layer through the contact hole.

The wiring 803a is provided so as to connect the contact regions in the island-shaped semiconductor layer to each other, so that an element including the island-shaped semiconductor layer 303 functions not as a transistor but as a capacitor.

The wiring 803b is electrically connected to the gate electrode 503 through the contact hole.

The wiring 804a is electrically connected to the p-type impurity region in the island-shaped semiconductor layer 304 through the contact hole.

The wiring 804b is electrically connected to the n-type impurity region in the island-shaped semiconductor layer 304 through the contact hole.

The wirings 805a and 805b are electrically connected to the island-shaped semiconductor layer 305 through the contact holes.

Here, an element including the island-shaped semiconductor layer 301 is an n-channel thin film transistor.

An element including the island-shaped semiconductor layer 302 is a p-channel thin film transistor.

An element including the island-shaped semiconductor layer 303 is a capacitor.

An element including the island-shaped semiconductor layer 304 is a PIN diode.

An element including the island-shaped semiconductor layer 305 is a resistor.

As the interlayer insulating film 701, a silicon oxide film, a silicon nitride film, a silicon oxide film containing nitrogen, a silicon nitride film containing oxygen, polyimide, acrylic, siloxane polymer, or the like can be used.

The interlayer insulating film 701 is either a single layer or a stacked layer.

The interlayer insulating film 701 can be formed by a CVD method, a sputtering method, or the like.

It is preferable that the thickness of the interlayer insulating film 701 be 200 nm to 5 μm.

Like the material of the substrate 100, in the case where laser cutting is performed from the back-surface side of the substrate 100, it is necessary to recognize a laser cutting portion by eyes and to transmit laser light, and therefore, it is preferable to use a light-transmissive insulating film as the interlayer insulating film 701.

Note that a silicon oxide film, a silicon nitride film, a silicon oxide film containing nitrogen, a silicon nitride film containing oxygen, polyimide, acrylic, siloxane polymer, and the like are examples of the light-transmissive insulating film.

The wirings can be formed using a metal such as aluminum, titanium, molybdenum, tungsten, gold, silver, or copper, or a transparent conductor such as ITO (indium tin oxide).

Each of the wirings is either a single layer or a stacked layer.

Each of the wirings can be formed by a CVD method, a sputtering method, or the like.

It is preferable that the thickness of each of the wirings be 100 nm to 5000 nm.

Note that a material for forming an interlayer insulating film, a material for sealing, or the like can be cut by a YAG laser having a wavelength of 355 nm, but cannot be cut by a YAG laser having a wavelength of 1064 nm, a YAG laser having a wavelength of 532 nm, a YLF laser having a wavelength of 1047 nm, or the like.

Therefore, in order to selectively cut only the wiring without breaking the interlayer insulating film, it is preferable to use a YAG laser having a wavelength of 1064 nm, a YAG laser having a wavelength of 532 nm, an YLF laser having a wavelength of 1047 nm, or the like. In the case where it does not matter if the interlayer insulating film is broken, any kind of laser can be used.

Further, in the case where irradiation with laser light is performed from the top-surface side of the wiring, it is important that any light-blocking film is not disposed so as to overlap with the wiring on the wiring.

To the contrary, in the case where irradiation with laser light is performed from the bottom-surface side of the wiring, it is important that any light-blocking film is not disposed so as to overlap with the wiring under the wiring.

That is, it is important that any light-blocking film is not disposed on the pathway for laser-light irradiation.

Specifically, a light-reflective conductive film (metal film) of a gate material, an antenna material, or the like may be disposed so as not to overlap with the wiring and a light-transmissive insulating film may be used as the insulating film.

The structure in which any light-blocking film is not disposed on the pathway for laser-light irradiation allows that the visibility of the laser cutting portion may be assured to enable accurate alignment and that laser cutting may be performed selectively only on the wiring.

Figure 19:
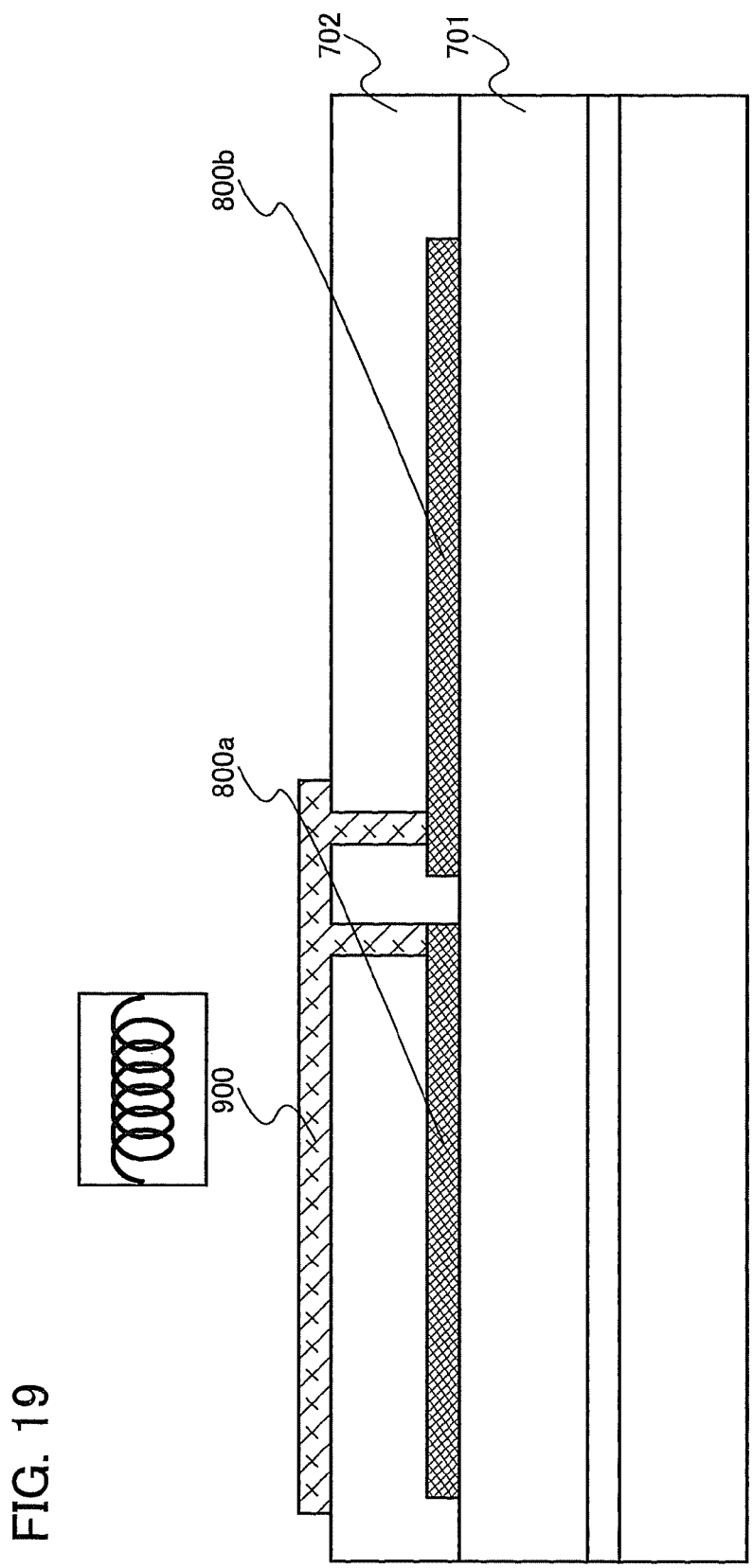
FIG. 19 is an example of a cross-sectional view showing a manufacturing method of a semiconductor device.

Next, an interlayer insulating film 702 is formed over wirings 800a and 800b formed over the interlayer insulating film 701, contact holes are formed in the interlayer insulating film 702, and an antenna 900 is formed over the interlayer insulating film 702 (FIG. 19).

Note that the wirings 800a and 800b are formed at the same time as the wirings 801a to 801c, 802a to 802c, 803a and 803b, 804a and 804b, and 805a and 805b.

FIG. 19 is a cross-sectional view at a different position from the positions of FIGS. 10 to 17 and FIG. 18.

Note that one terminal of the antenna 900 is electrically connected to the wiring 800a through the contact hole.

The other terminal of the antenna 900 is electrically connected to the wiring 800b through the contact hole.

The interlayer insulating film 702 can be formed using a similar material to the material of the interlayer insulating film 701.

The antenna 900 can be formed using aluminum, titanium, molybdenum, gold, silver, copper, or the like.

The antenna 900 is either a single layer or a stacked layer.

The antenna 900 can be formed by a CVD method, a sputtering method, or the like.

It is preferable that the thickness of the antenna 900 be 1 μm to 10 μm.

Then, a protective film is formed over the antenna and sealing and/or the like are/is performed, so that a semiconductor device which performs wireless communication via an antenna is completed.

Although the semiconductor device which performs wireless communication via an antenna is described as an example in this embodiment, other semiconductor devices (for example, display devices and CPUs) can also be manufactured by using a similar method to this embodiment.

This embodiment can be combined with any other embodiment in this specification to be implemented.

Embodiment 4

Examples of the top-surface shape of an antenna will be described in this embodiment.

Figure 20A:
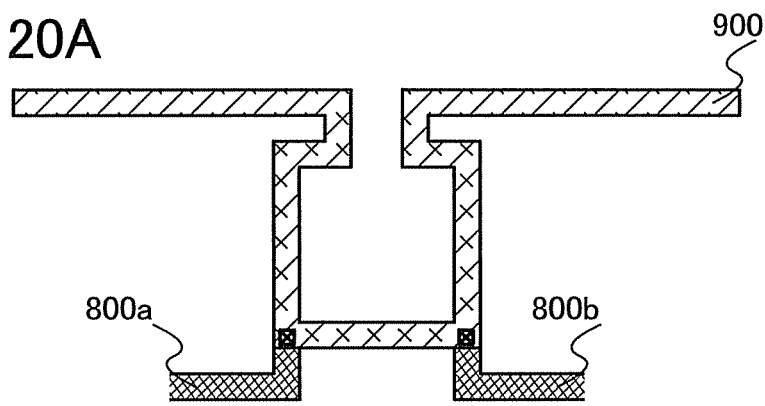
FIGS. 20A to 20C each illustrate an example of an antenna.
Figure 20B:
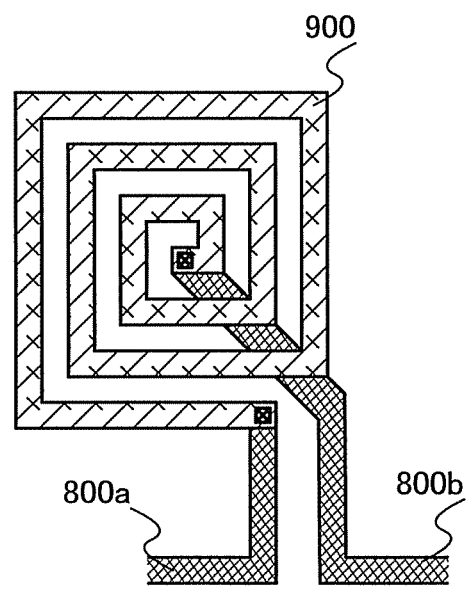
Figure 20C:
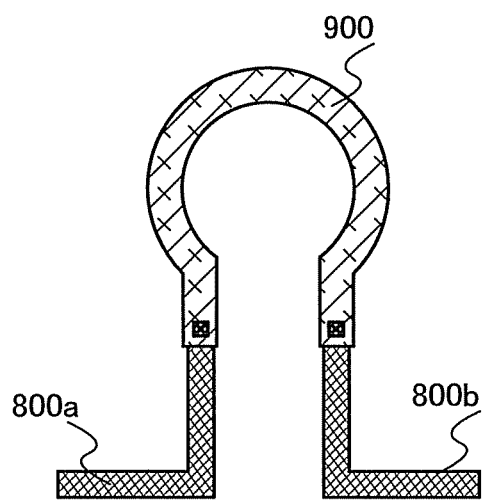

FIGS. 20A to 20C are overhead views of the antenna 900 and the wirings 800a and 800b shown in FIG. 19.

The antenna 900 shown in FIG. 20A includes a linear-shape portion.

An antenna including a linear-shape portion, to which the system of receiving radio waves is easily applied, is suitable for communication with high-frequency wave (for example, at UHF).

The antenna 900 shown in FIG. 20B includes a spiral-shape portion.

An antenna including a spiral-shape portion, to which the system of receiving magnetic waves is easily applied, is suitable for communication with low-frequency wave (for example, at HF).

The spiral shown in FIG. 20B is rectangular and has a plurality of roll numbers.

The antenna 900 shown in FIG. 20C has a curved-line shape in which the number of rolls is one.

Note that, like the antenna 900 shown in FIG. 20C, the spiral of FIG. 20B may have a curved-line shape and the number of rolls may be one.

The antenna shapes described in this embodiment are examples.

Any of the antenna shapes has drawback and advantage, and therefore, the antenna shape can be determined as appropriate.

This embodiment can be combined with any other embodiment in this specification to be implemented.

Embodiment 5

The adjustment of inductance of an antenna will be described in this embodiment.

Figure 21A:
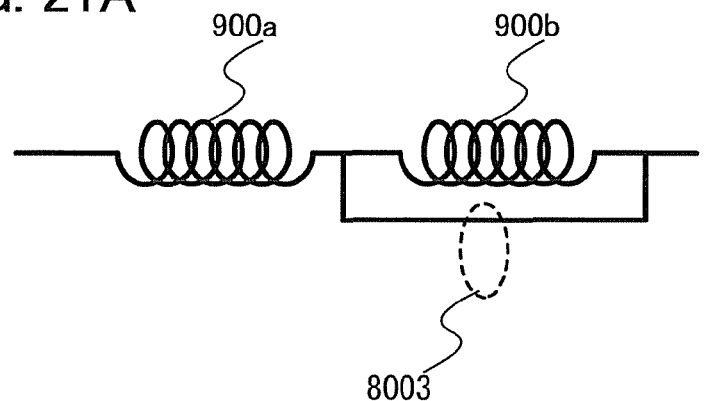
FIGS. 21A and 21B each illustrate an example of an antenna.

In this case, an antenna 900a and an antenna 900b are connected in series and the antenna 900b is connected to a wiring indicated by a dotted-line portion 8003 in parallel (FIG. 21A).

Figure 21B:
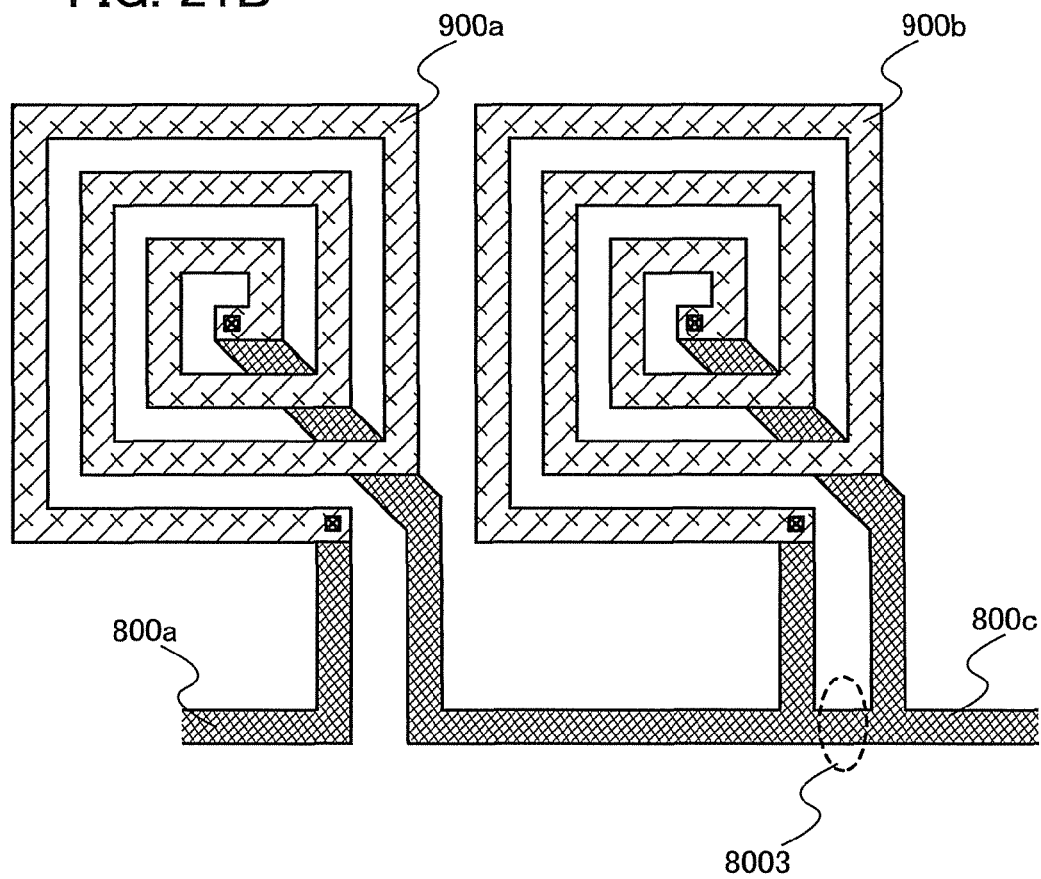

For example, the method in which spiral-shaped antennas are connected in series as shown in FIG. 21B and a wiring 800c which is a second terminal is short-circuited at a portion indicated by a dotted-line portion 8003 can be employed.

A wiring 800a which is a first terminal is electrically connected to the antenna 900a.

What is important here is that the length of the dotted-line portion 8003 should be shorter than the length of the spiral shape of the antenna 900b.

Since the length of the dotted-line portion 8003 is shorter than the length of the spiral shape of the antenna 900b, the resistance of the antenna 900b can be regarded as very high, so that a current flows preferentially into the dotted-line portion 8003.

Specifically, when the length of the spiral shape of the antenna 900b is at least 100 times as much as the length of the dotted-line portion 8003, the resistance of the antenna 900b can be regarded as very high.

Then, the dotted-line portion 8003 is cut to have the antenna 900b functioning, thereby increasing the length of the antenna, so that the inductance of the antenna can be increased.

Figure 22A:
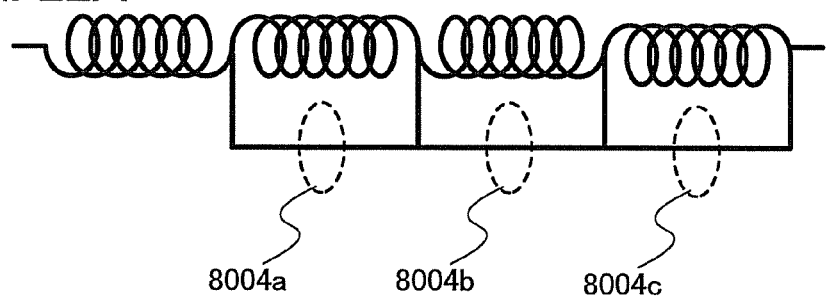
FIGS. 22A and 22B each illustrate an example of an antenna.
Figure 22B:
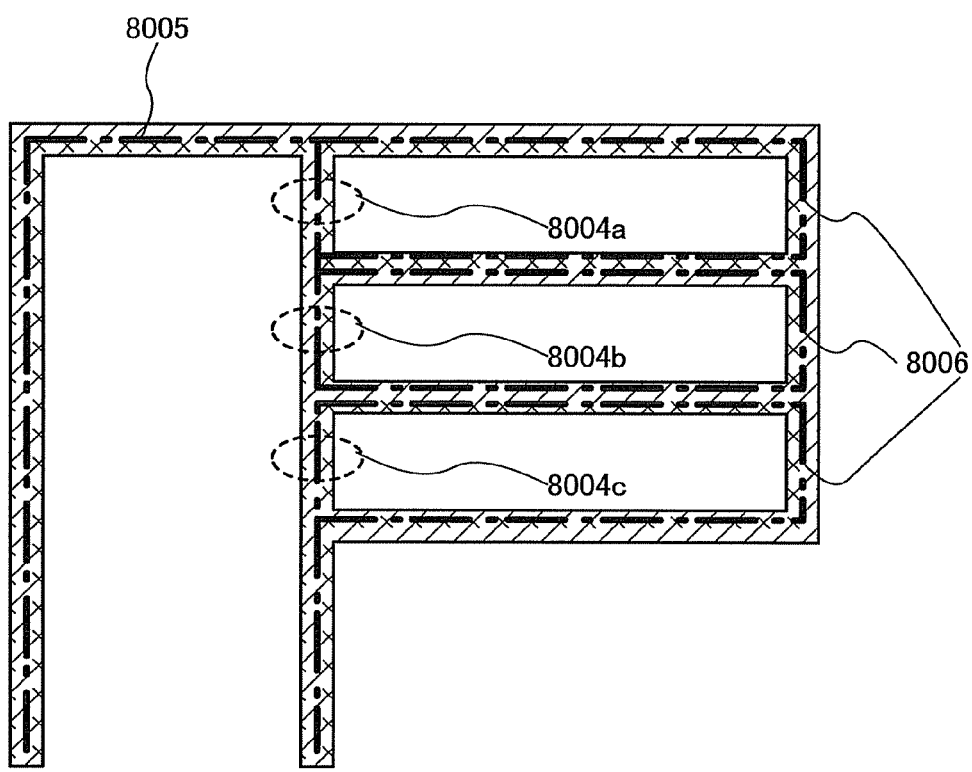

Further, another example is shown in FIGS. 22A and 22B.

In FIG. 22A, respective antennas connected to dotted-line portions 8004a, 8004b, and 8004c in parallel are secondary antennas.

Specifically, in a shape shown in FIG. 22B, the antenna length can be increased by cutting dotted-line portions 8004a, 8004b, and 8004c.

The shape shown in FIG. 22B illustrates a structure in which a small-loop group 8006 is connected to one side of a large loop 8005.

The small-loop group is provided for one side of the rectangular loop in FIG. 22B; however, in the case of a curved-line loop, a small-loop group may be provided for a line included in the curved-line loop.

That is, a small-loop group which is connected to a large loop may be provided, and a part of the large loop is cut to open a small loop in the small-loop group.

The inductance is adjusted by opening the small loop.

Use application as an antenna is described in this embodiment.

On the other hand, an antenna is one mode of a coil.

Therefore, the shapes of an antenna described in this and the other embodiments in this specification each can be applied to any mode of coils.

This embodiment can be combined with any other embodiment in this specification to be implemented.

Embodiment 6

In this embodiment, an example of a method for manufacturing a flexible semiconductor device which is a deformed example of Embodiment 3 (FIGS. 10 to 19) will be described.

Figure 23:
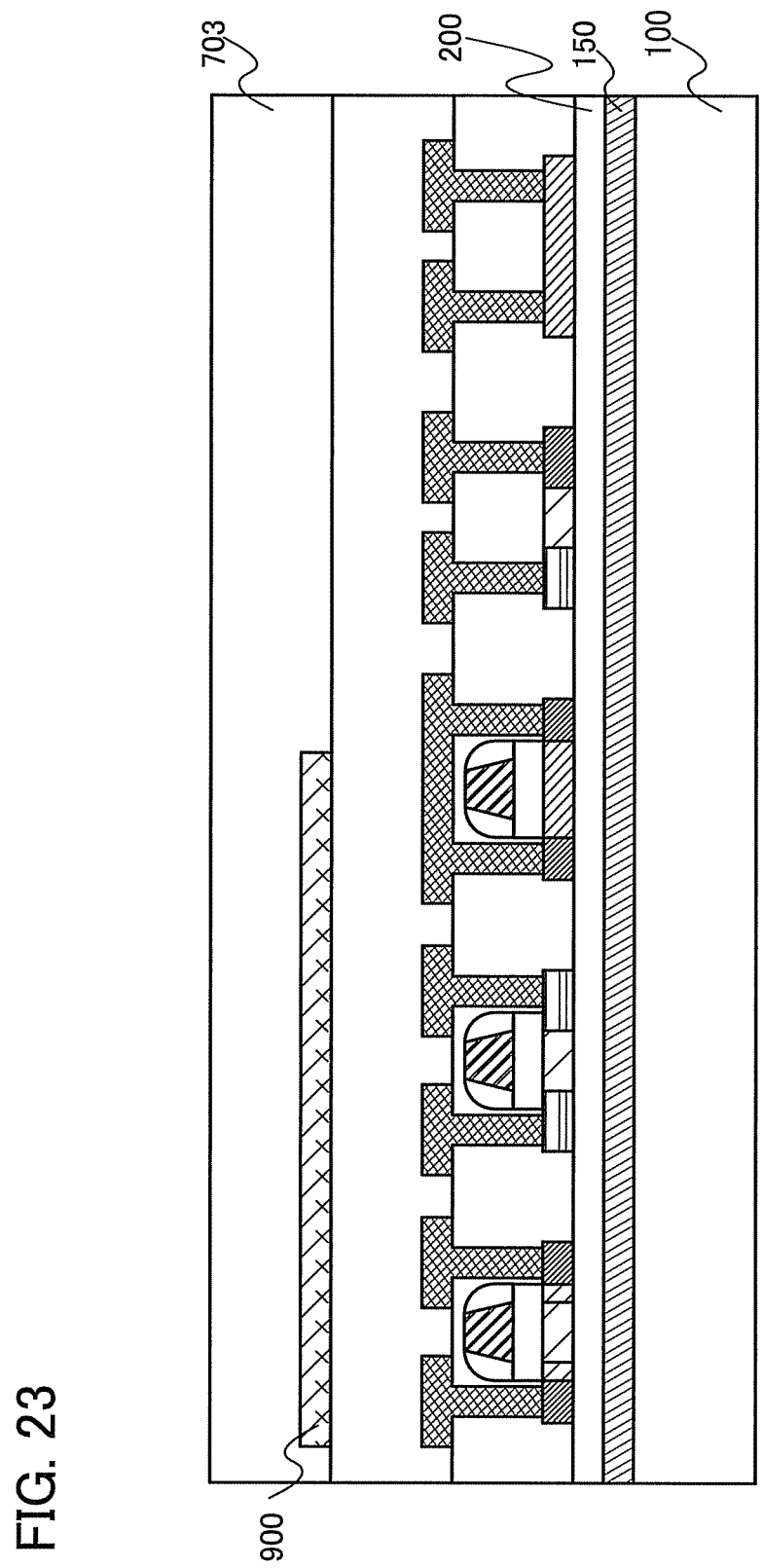
FIG. 23 is an example of a cross-sectional view showing a manufacturing method of a semiconductor device.

A view is shown in which after the formation of the antenna 900, a protective film 703 is formed over the antenna (FIG. 23).

The protective film 703 can be formed in a similar manner to the manners of the interlayer insulating films 701 and 702.

FIG. 23 is different from FIGS. 10 to 19 in that a separation layer 150 is formed between the substrate 100 and the base insulating film 200.

As the separation layer 150, a structure in which an insulating film is stacked on a metal film, a single-layer semiconductor film, a single-layer metal film, or the like can be used.

In the structure in which an insulating film is stacked on a metal film, a tungsten film, a molybdenum film, a titanium film, a tantalum film, or the like can be used as the metal film.

The metal film can be formed by a CVD method, a sputtering method, or the like.

It is preferable that the thickness of the metal film be 100 nm to 1000 nm.

Then, after the metal film is formed, a silicon target is sputtered with an argon gas containing oxygen, thereby forming an insulating film formed from silicon oxide.

At this time, the surface of the metal film is oxidized by oxygen, which enables separation by mechanical force at a separation step later.

Alternatively, a silicon target may be sputtered with argon gas containing nitrogen, thereby nitriding the surface of the metal film and forming an insulating film formed of a silicon nitride film.

Further, before the formation of an insulating film, an oxygen plasma treatment or a nitrogen plasma treatment may be performed on the surface of the metal film to form a separation layer.

In the case of using a separation layer formed using silicon, separation can be performed by etching silicon by using halogen fluoride (for example, chlorine fluoride (ClF), chlorine trifluoride (ClF$_3$), bromine fluoride (BrF), bromine trifluoride (BrF$_3$), iodine fluoride (IF), or iodine trifluoride (IF$_3$) in the later separation step.

Halogen fluoride has an act of etching silicon, metal (for example, aluminum), or the like.

Therefore, metal (for example, aluminum) may be used instead of silicon, as the separation layer, and halogen fluoride may be used as the etching material of the separation layer.

Figure 24:
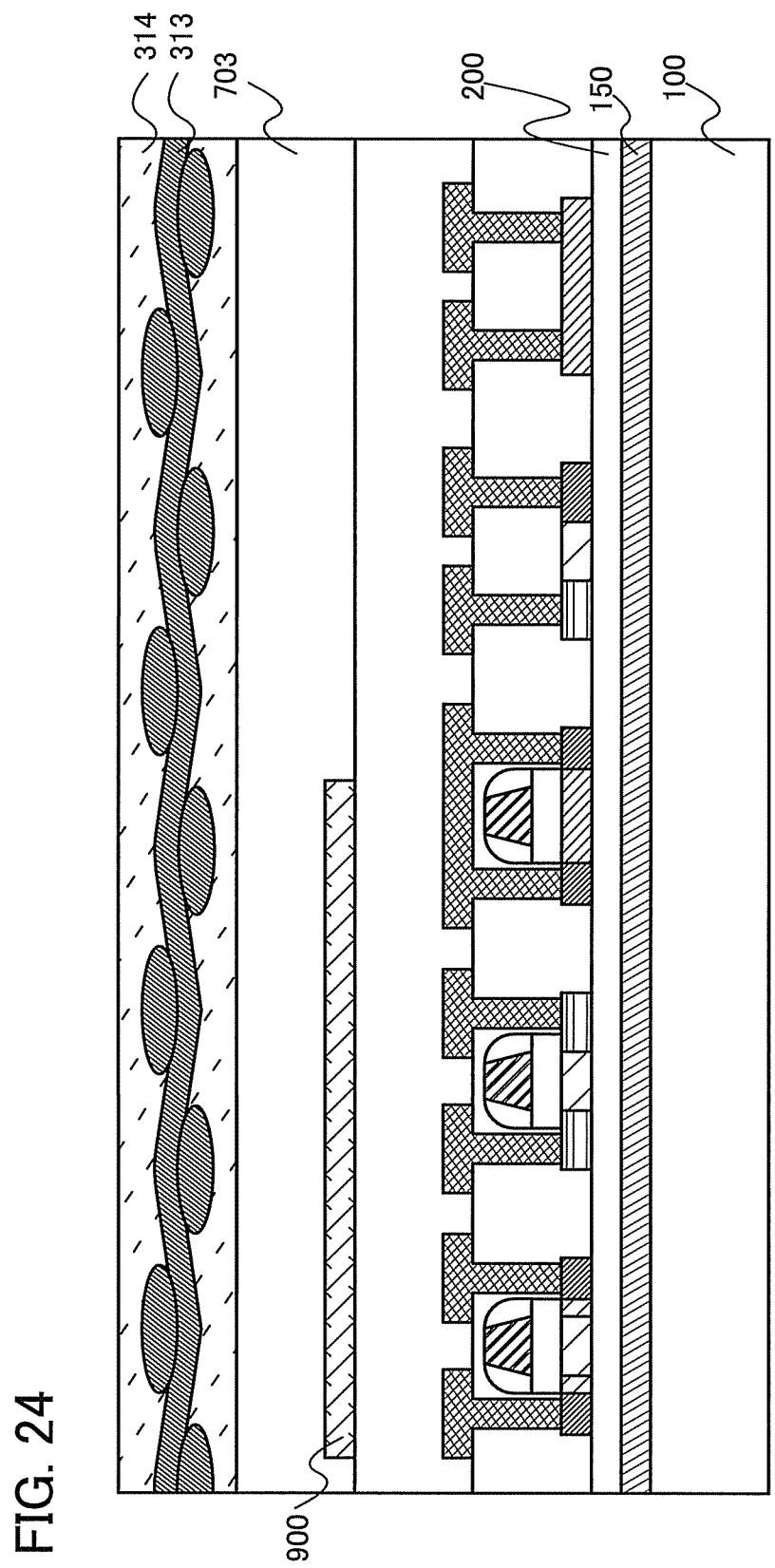
FIG. 24 is an example of a cross-sectional view showing a manufacturing method of a semiconductor device.

Next, a sealing material in which a fibrous body 313 is impregnated with an organic resin 314 is bonded onto the protective film 703 by thermocompression (FIG. 24).

As the organic resin 314, a thermosetting resin, a thermoplastic resin, or the like can be used.

As examples of the thermosetting resin, there are an epoxy resin, an unsaturated polyester resin, a polyimide resin, a bismaleimide-triazine resin, a cyanate resin, and the like.

As examples of the thermoplastic resin, there are a polyphenylene oxide resin, a polyetherimide resin, a fluorine resin, and the like.

The thermosetting resin or the thermoplastic resin that enables thermocompression bonding is advantageous since the manufacturing process is simplified.

The fibrous body 313 is a woven fabric or a nonwoven fabric.

The woven fabric is a cloth made by weaving a plurality of fibers.

The nonwoven fabric is a cloth made not by weaving a plurality of fibers but by, for example, fusing, bonding, or entwining them.

As the fiber, the following can be used: a polyvinyl alcohol fiber, a polyester fiber, a polyamide fiber, a polyethylene fiber, an aramid fiber, a polyparaphenylene benzobisoxazole fiber, a glass fiber, a carbon fiber, or the like.

As examples of the glass fiber, there are a glass fiber using E glass, a glass fiber using S glass, a glass fiber using D glass, a glass fiber using Q glass, and the like.

Note that the fibrous body may be formed by using either only one kind of material among a plurality of materials of fibers or plural kinds of materials thereof.

As the sealing material, an insulator such as an epoxy resin or an aramid resin may be used as well.

The insulator impregnated with an organic resin is also called a prepreg.

A prepreg is formed typically as follows: a fibrous body is impregnated with a varnish in which a matrix resin is diluted with an organic solvent, and then, drying is performed so that the organic solvent is volatilized and the matrix resin is semi-cured.

Sealing with the use of a prepreg is preferable since a circuit can be protected against pressure and stress.

Figure 25:
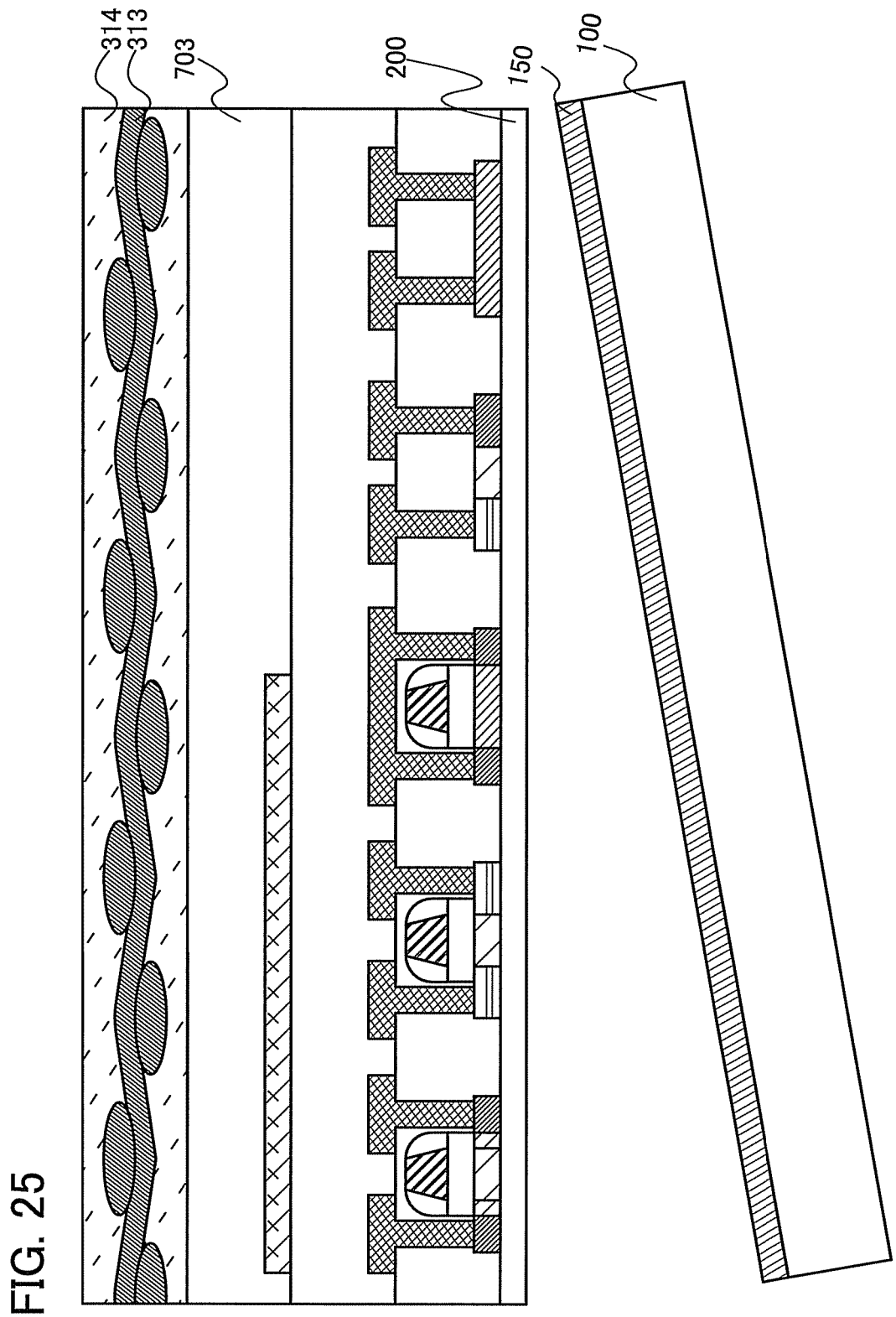
FIG. 25 is an example of a cross-sectional view showing a manufacturing method of a semiconductor device.

Next, after the thermocompression bonding of the sealing material, mechanical force is applied (for example, by pulling or pushing), thereby performing a separation step of separating the substrate 100 (FIG. 25).

In this case, because of the oxidized or nitrided surface of the metal film of the separation layer, the adhesiveness between the metal film and the insulating film is weak.

Therefore, the substrate 100 is separated selectively by applying a mechanical force.

Moisture may be injected from the side surface when the substrate 100 is selectively separated.

When moisture is injected, moisture enters the separation interface, which results in electrical connection between the circuit side and the substrate side by the moisture.

Static electricity is generated at the time of the separation; however, electrical connection obtained by moisture has great tendency to prevent the problem of electrostatic breakdown at the time of separation.

Note that in order to improve the electrical conductivity of moisture, an aqueous solution such as salt water or carbonic water may be used. Carbonic water is preferable since a circuit is adversely affected by salt.

In the case where a single-layer film is formed instead of the stacked-layer structure, as the separation layer, the separation layer formed from silicon is selectively etched by halogen fluoride, thereby selectively separating the substrate 100.

The step of selectively separating at least the substrate 100 by using a separation layer in this manner is referred to as a separation step.

A circuit after a substrate is selectively separated by the separation step is referred to as a separation circuit in this specification.

The substrate is separated, so that only a circuit as thin as a skin remains; therefore, the circuit may also be referred to as a peel circuit.

Note that the peel circuit may be formed by another method such as a method for manufacturing a peel circuit, in which a substrate is removed by an etchant, a method for manufacturing a peel circuit, in which a circuit is provided for a flexible substrate, or the like.

Since the peel circuit which is very thin, the peel is very weak against pulling, pressure from the outside, and the like.

To the contrary, the insulator in which a fibrous body is impregnated with an organic resin, which has the fibrous body, has the resistance against pulling and can disperse pressure from the outside.

Therefore, by sandwiching the peel circuit including a thin film transistor by the insulator in which a fibrous body is impregnated with an organic resin, the peel circuit can be protected against pulling and pressure from the outside.

Figure 26:
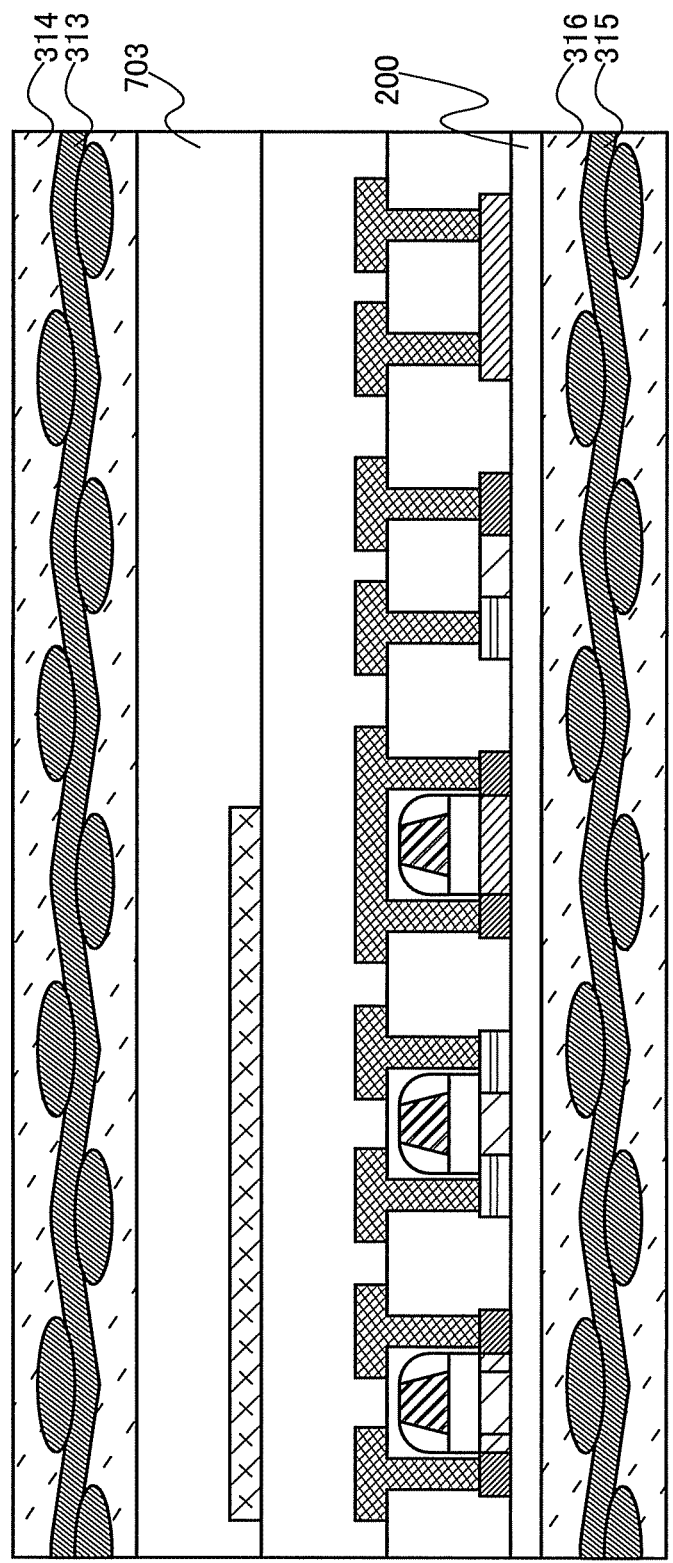
FIG. 26 is an example of a cross-sectional view showing a manufacturing method of a semiconductor device.

Therefore, a sealing material in which a fibrous body 315 is impregnated with an organic resin 316 is bonded to the bottom surface of the base insulating film 200 by thermocompression (FIG. 26).

The fibrous body 315 can be formed in a similar manner to the manner of the fibrous body 313.

The organic resin 316 can be formed in a similar manner to the manner of the organic resin 314.

Note that although the prepreg is used as the sealing material, an insulator including no fibrous body, such as an epoxy resin or an aramid resin may be used as well.

However, it is preferable to use a prepreg in the case of using a peel circuit because a flexible semiconductor device having the resistance against pulling and pressure from the outside can be used.

The peel circuit is very fragile, and therefore, laser cutting is preferable as a cutting method.

Scissors, a cutter, a needle, or the like cut other elements in addition to a wiring.

Further, the cutting with the use of scissors, a cutter, a needle, or the like provides high possibility of breaking of the fragile peel circuit due to pressure or stress.

In order to perform laser cutting even after sealing, it is preferable that the sealing material be a light-transmitting material.

A prepreg, an aramid resin, or the like, which can be used as the sealing material, has the light-transmitting property.

As for an epoxy resin, light-transmitting one and non-light-transmitting one are being commercially available, and therefore, it is preferable to use the light-transmitting one.

This embodiment can be combined with any other embodiment in this specification to be implemented.

Embodiment 7

In this embodiment, an example of a semiconductor device which performs wireless communication via an antenna will be described.

Figure 27:
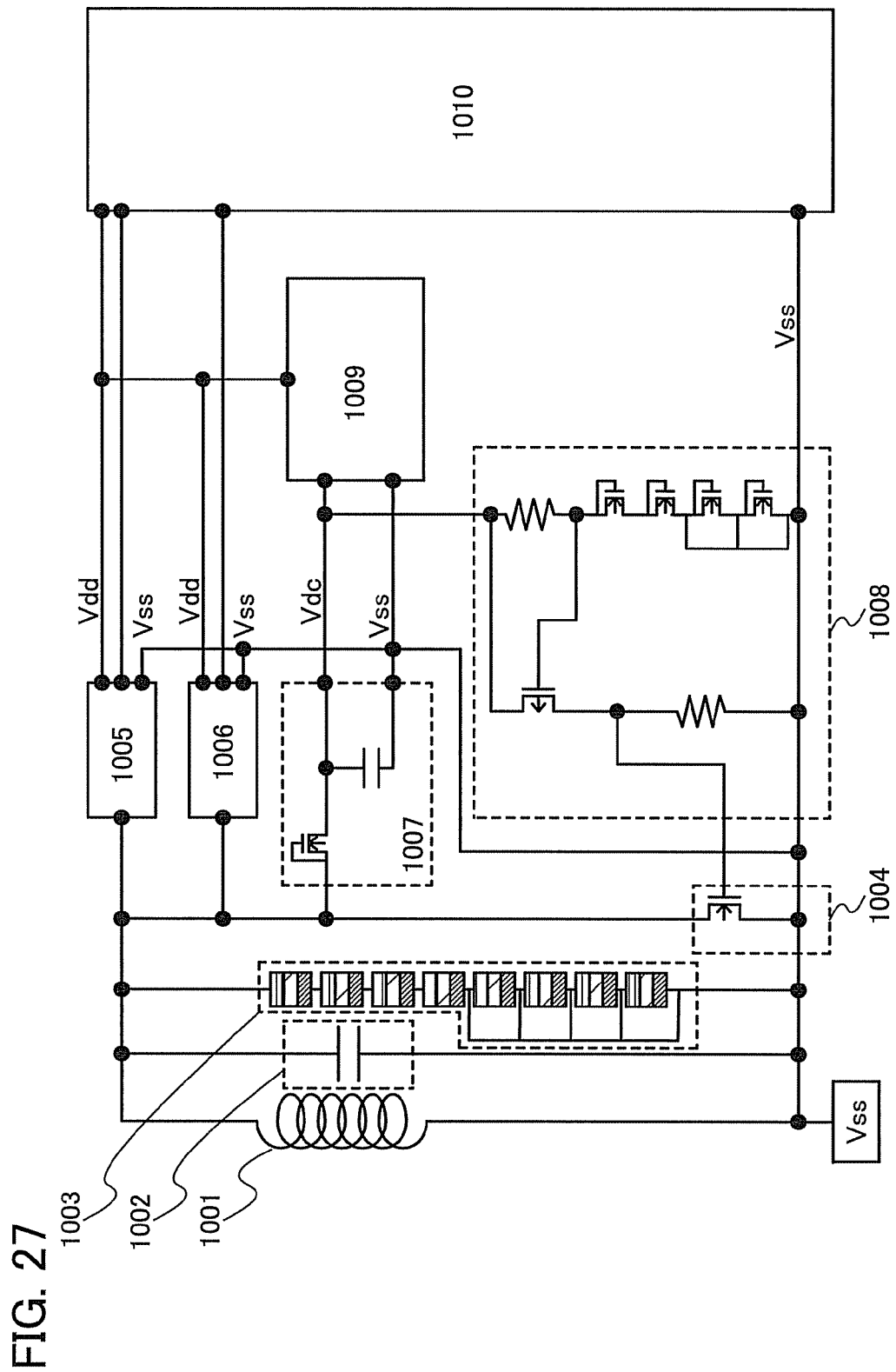
FIG. 27 illustrates an example of a semiconductor device which performs wireless communication via an antenna.

The semiconductor device according to this embodiment includes an antenna 1001, a resonant capacitor 1002, a limiter circuit 1003, a switch 1004, a demodulating circuit 1005, a modulating circuit 1006, a rectifying circuit 1007, a voltage detecting circuit 1008, a constant voltage circuit 1009, and a logic circuit 1010 (FIG. 27).

Reference symbol Vdd denotes a fixed power source potential or a high power source potential.

Reference symbol Vss denotes a low power source potential or GND (ground, 0V).

There is no limitation on the respective voltage levels of Vdd and Vss as long as the potential of Vdd is relatively higher than that of Vss.

As the antenna 1001, by which electromagnetic waves are transmitted and received, any antenna described in another embodiment in this specification can be used.

In particular, it is preferable to use an antenna in which the inductance can be adjusted.

Note that one terminal of the antenna 1001 is electrically connected to the resonant capacitor 1002, the limiter circuit 1003, the switch 1004, the demodulating circuit 1005, the modulating circuit 1006, and the rectifying circuit 1007.

The other terminal of the antenna 1001 is electrically connected to Vss.

The resonant capacitor 1002 is provided to adjust the resonant frequency of electromagnetic waves which are received and/or transmitted.

A capacitor may be used as the resonant capacitor 1002.

Any capacitor can be used; for example, the capacitor described in Embodiment 3 can be used.

One terminal of the resonant capacitor 1002 is electrically connected to the limiter circuit 1003, the switch 1004, the demodulating circuit 1005, the modulating circuit 1006, and the rectifying circuit 1007.

The other terminal of the resonant capacitor 1002 is electrically connected to Vss.

The limiter circuit 1003 is provided so that the demodulating circuit 1005, the modulating circuit 1006, the rectifying circuit 1007, or the like can be prevented from being broken by overcurrent which flows therein.

Therefore, one terminal of the limiter circuit 1003 may be provided so as to be electrically connected between the one terminal of the antenna 1001 and respective input terminals of the demodulating circuit 1005, the modulating circuit 1006, and the rectifying circuit 1007.

The other terminal of the limiter circuit 1003 is electrically connected to Vss so that overcurrent flows to Vss.

As the limiter circuit 1003, for example, diodes which are connected in series can be used.

As the diode, it is preferable to use a PIN diode, a PN diode, or the like that has high breaking strength against overcurrent.

Further, as the limiter circuit 1003, it is preferable to use an element formed using a diode in which the threshold voltage can be adjusted.

If the threshold voltage of the limiter circuit 1003 is lower than that assumed at the time of design, not overcurrent but normal current is detected as overcurrent to flow to Vss.

If the normal current flows to Vss, other circuit operation is stopped.

Therefore, when the threshold voltage is lower than that assumed at the time of design, adjustment such that the threshold voltage will be increased is needed.

The switch 1004 is provided in order to protect the other circuits by supplying a signal transmitted from the antenna to Vss in accordance with a signal from the voltage detecting circuit 1008.

Therefore, one of a source and a drain of the switch 1004 is provided so as to be electrically connected between the one terminal of the antenna 1001 and the respective input terminals of the demodulating circuit 1005, the modulating circuit 1006, and the rectifying circuit 1007.

The other of the source and the drain of the switch 1004 is electrically connected to Vss.

Further, a gate of the switch 1004 is electrically connected to a connection portion between a transistor and a resistor in the voltage detecting circuit 1008.

As the switch 1004, a transistor can be used.

Note that although an n-channel transistor is used as the switch 1004 in FIG. 27, a p-channel transistor may be used as well.

The demodulating circuit 1005 is a circuit which performs demodulation.

The modulating circuit 1006 is a circuit which performs modulation.

The rectifying circuit 1007 is a circuit which rectifies signals transmitted from the antenna.

An input terminal of a diode in the rectifying circuit 1007 is electrically connected to the one terminal of the antenna.

An output terminal of the diode in the rectifying circuit 1007 outputs Vdc and is electrically connected to Vss via a capacitor.

By using an element including a diode in which the threshold voltage can be adjusted in the rectifying circuit 1007, the threshold voltage of the output of the rectifying circuit can be increased.

By increasing the threshold voltage of the output of the rectifying circuit 1007, overcurrent can be prevented from flowing therethrough.

However, when the threshold voltage of the output of the rectifying circuit 1007 is increased, communication distance of the semiconductor device is decreased.

Therefore, it is more advantageous to adjust the threshold voltage of a diode included in the voltage detecting circuit 1008 for preventing overcurrent flowing therethrough.

Accordingly, it is preferable that an element including a diode in which the threshold voltage can be adjusted is not used in the rectifying circuit 1007 and an element including a diode in which the threshold voltage can be adjusted is used in the voltage detecting circuit 1008.

The voltage detecting circuit 1008 includes a first resistor, a second resistor, a p-channel transistor, and an element including a diode.

The output Vdc of the rectifying circuit 1007 is electrically connected to one terminal of the first resistor and one of a source and a drain of the p-channel transistor.

The other terminal of the first resistor is electrically connected to a gate of the p-channel transistor and an input terminal of the element including a diode.

The other of the source and the drain of the p-channel transistor is electrically connected to one terminal of the second resistor and the gate of the switch 1004.

An output terminal of the element including a diode and the other terminal of the second resistor are electrically connected to Vss.

In this structure, a voltage which is decreased to be lower than Vdc is applied to the input terminal of the element including a diode by the first resistor.

Then, in the case where the voltage which is decreased to be lower than Vdc is lower than the threshold voltage of the element including a diode, no current flows through the element including a diode.

When no current flows through the element including a diode, the p-channel transistor is not turned on.

On the other hand, in the case where the voltage which is decreased to be lower than Vdc is higher than the threshold voltage of the element including a diode, current flows through the element including a diode.

When current flows through the element including a diode, the p-channel transistor is turned on.

When the p-channel transistor is turned on, the switch 1004 is turned on, resulting in flow of a signal from the antenna to Vss before the signal is input into the rectifying circuit.

That is, the switch 1004 and the voltage detecting circuit 1008 are included in a limiter circuit which is different from the limiter circuit 1003.

The first resistor is provided in order to provide a difference between the potentials of the gate of the p-channel transistor and the one of the source and the drain of the p-channel transistor.

The second resistor is provided so as to apply a voltage to the gate of the switch 1004.

In this embodiment, as the element including a diode, an element in which diode-connected n-channel transistors are connected in series as shown in FIG. 1B is used.

The voltage detecting circuit 1008 is for detecting the output voltage of the rectifying circuit; therefore, a voltage which is applied to the voltage detecting circuit is lower than a voltage which is input into the limiter circuit 1003.

Further, current after being rectified by the rectifying circuit 1007 flows into the logic circuit through the constant voltage circuit 1009, and therefore, it is preferable that the rectified current is controlled precisely.

Therefore, it is preferable that a diode formed using a transistor in which the threshold voltage is easily controlled by design be used in the voltage detecting circuit 1008, rather than a PIN diode, a PN diode, or the like.

That is, it is preferable that a large current flowing directly from the antenna is limited by a PIN diode used in the limiter circuit 1003 and a small current flowing from the rectifying circuit is controlled precisely by a diode formed using a transistor used in the voltage detecting circuit.

Note that the above description does not limit the application of a PIN diode, a PN diode, or the like; therefore, a PIN diode, a PN diode, or the like can also be applied in the voltage detecting circuit 1008.

The constant voltage circuit 1009 is provided in order to convert Vdc into a predetermined voltage to supply to the logic circuit.

The logic circuit 1010 is provided in order to supply a signal in response to a signal from the demodulating circuit.

In this manner, it is very preferable to apply the present invention to a semiconductor device which performs wireless communication via an antenna.

This embodiment can be combined with any other embodiment in this specification to be implemented.

Embodiment 8

In the other embodiments described above, examples of the structure in which a unit including a serially-connected primary-diode group and a unit including a serially-connected secondary-diode group are connected in series are described.

Further, when a secondary diode which is short-circuited by a wiring and a primary diode which is not short-circuited by a wiring are connected in series, the threshold voltage can be adjusted.

Figure 28A:
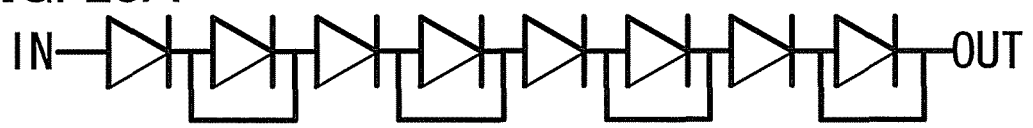
FIGS. 28A to 28C each illustrate an example of a serially-connected diode group.

For example, a secondary diode which is short-circuited by a wiring and a primary diode which is not short-circuited by a wiring may be arranged alternately (FIG. 28A).

Figure 28B:
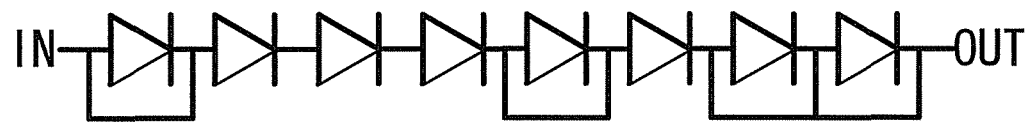

Alternatively, secondary diodes which are each short-circuited by a wiring and primary diodes which are each not short-circuited by a wiring may be arranged randomly (FIG. 28B).

Figure 28C:
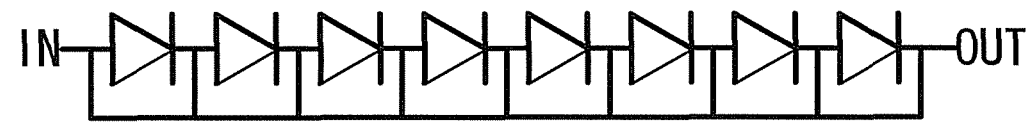

Alternatively, only diodes which are each short-circuited by a wiring may be connected in series (FIG. 28C).

Figure 29A:
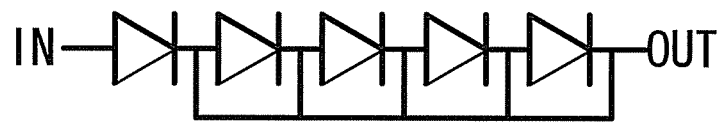
FIGS. 29A to 29C each illustrate an example of a serially-connected diode group.

Further, one primary diode and a plurality of secondary diodes may be connected (FIG. 29A).

Figure 29B:
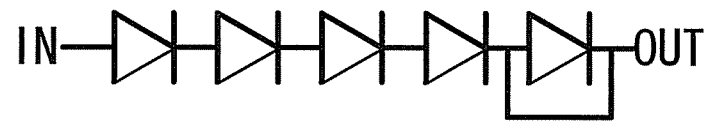

Alternatively, a plurality of primary diodes and one secondary diode may be connected (FIG. 29B).

Figure 29C:
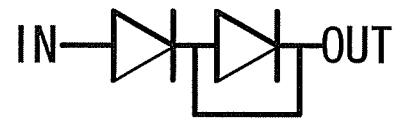

Alternatively, one primary diode and one secondary diode may be connected (FIG. 29C).

Also in the case where the technical idea of an element in which the characteristic value can be adjusted is applied to an antenna, similar arrangements to the arrangements of diodes can be applied.

The present invention is not limited to the structures described in this embodiment.

This embodiment can be combined with any other embodiment in this specification to be implemented.

Embodiment 9

Semiconductor devices which perform wireless communication via an antenna (RED tags, wireless tags, IC chips, wireless chips, noncontact signal processing equipment, semiconductor integrated circuit chips, or the like) can have the application forms such as attachment to the surfaces of products or living things (such as human beings, animals, and plants), embedding into the products or living things (such as human beings, animals, and plants), and the like.

The semiconductor device which performs wireless communication via an antenna enables information management without contact.

Because of the wireless characteristic, the present invention leads to the environment where information and communication technology can be used unconsciously anytime and anywhere.

The present invention can also be applied to semiconductor devices other than the semiconductor devices which perform wireless communication via an antenna.

As examples of the semiconductor devices other than the semiconductor devices which perform wireless communication via an antenna, there are various devices such as display devices, photo ICs, and CPUs.

This embodiment can be combined with any other embodiment in this specification to be implemented.

This application is based on Japanese Patent Application serial no. 2008-267427 filed with Japan Patent Office on Oct. 16, 2008, the entire contents of which are hereby incorporated by reference.

REFERENCE NUMERALS 11 diode, 12 diode, 13 diode, 14 diode, 15 diode, 16 diode, 17 diode, 18 diode, 21 dotted-line portion, 22 dotted-line portion, 23 dotted-line portion, 24 dotted-line portion, 45 mask, 100 substrate, 111 mask, 112 mask, 114 mask, 122 mask, 123 mask, 124 mask, 125 mask, 131 mask, 133 mask, 134 mask, 135 mask, 142 mask, 143 mask, 144 mask, 145 mask, 150 separation layer, 200 base insulating film, 301 island-shaped semiconductor layer, 301$a$ region, 301$b$ region, 301$c$ region, 301$d$ region, 301$e$ region, 301$f$ region, 302 island-shaped semiconductor layer, 302$a$ region, 302$b$ region, 303 island-shaped semiconductor layer, 303$a$ region, 303$b$ region, 304 island-shaped semiconductor layer, 304$a$ region, 304$b$ region, 305 island-shaped semiconductor layer, 313 fibrous body, 314 organic resin, 315 fibrous body, 316 organic resin, 350$a$ semiconductor layer, 350$b$ semiconductor layer, 350$c$ semiconductor layer, 350$d$ semiconductor layer, 350$e$ semiconductor layer, 350$f$ semiconductor layer, 350$g$ semiconductor layer, 350$h$ semiconductor layer, 400 gate insulating film, 401 gate insulating film, 402 gate insulating film, 403 gate insulating film, 501 gate electrode, 502 gate electrode, 503 gate electrode, 550$a$ gate electrode, 550$b$ gate electrode, 550$c$ gate electrode, 550$d$ gate electrode, 550$e$ gate electrode, 550$f$ gate electrode, 550$g$ gate electrode, 550$h$ gate electrode, 601$a$ sidewall, 601$b$ sidewall, 602$a$ sidewall, 602$b$ sidewall, 603$a$ sidewall, 603$b$ sidewall, 701 interlayer insulating film, 702 interlayer insulating film, 703 protective film, 800$a$ wiring, 800$b$ wiring, 800$c$ wiring, 801$a$ wiring, 801$b$ wiring, 801$c$ wiring, 802$a$ wiring, 802$b$ wiring, 802$c$ wiring, 803$a$ wiring, 803$b$ wiring, 804$a$ wiring, 804$b$ wiring, 805$a$ wiring, 805$b$ wiring, 850$a$ wiring, 850$b$ wiring, 850$c$ wiring, 850$d$ wiring, 850$e$ wiring, 900 antenna, 900$a$ antenna, 900$b$ antenna, 1001 antenna, 1002 resonant capacitor, 1003 limiter circuit, 1004 switch, 1005 demodulating circuit, 1006 modulating circuit, 1007 rectifying circuit, 1008 voltage detecting circuit, 1009 constant voltage circuit, 1010 logic circuit, 8001 channel width of primary diode, 8002 channel width of secondary diode, 8003 dotted-line portion, 8004$a$ dotted-line portion, 8004$b$ dotted-line portion, 8004$c$ dotted-line portion, 8005 large loop, 8006 small-loop group

The invention claimed is:

1. A method for manufacturing a semiconductor device comprising the steps of:

forming a first diode group including a plurality of first diodes and a second diode group comprising a plurality of second diodes, the plurality of first diodes being connected in series and the plurality of second diodes being connected in series wherein each one of the plurality of second diodes is connected to corresponding one of a plurality of wirings in parallel; and cutting at least one of the plurality of wirings to adjust a threshold voltage of a element, wherein a channel width of each of the second diodes is smaller than a channel width of each of the first diodes.

2. The method for manufacturing the semiconductor device according to claim 1, wherein each of the first diodes and the second diodes and the wiring are each formed using a thin film, and wherein the cutting is performed by laser cutting.

3. The method for manufacturing the semiconductor device according to claim 1, wherein the cutting is performed by laser cutting.

4. A semiconductor device comprising an element in which a first diode group comprising a plurality of first diodes and a second diode group comprising a plurality of second diodes, the plurality of first diodes being connected in series and the plurality of second diodes being connected in series, wherein each of the plurality of second diodes is connected to a wiring in parallel, and wherein a channel width of each of the second diodes is smaller than a channel width of each of the first diodes.

5. The semiconductor device according to claim 4, wherein each of the first diodes and the second diodes and the wiring are each formed using a thin film.

6. The method for manufacturing the semiconductor device according to claim 1, wherein each of the first diodes and the second diodes is a transistor.

7. The semiconductor device according to claim 4, wherein each of the first diodes and the second diodes is a transistor.

* * * * *